(12) United States Patent
Riess et al.

(10) Patent No.: US 8,101,495 B2
(45) Date of Patent: Jan. 24, 2012

(54) MIM CAPACITORS IN SEMICONDUCTOR COMPONENTS

(75) Inventors: Philipp Riess, Munich (DE); Armin Fischer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 820 days.

(21) Appl. No.: 12/048,060

(22) Filed: Mar. 13, 2008

(65) Prior Publication Data
US 2009/0230507 A1    Sep. 17, 2009

(51) Int. Cl.
*H01L 21/8242* (2006.01)
(52) U.S. Cl. .................. 438/396; 257/E21.008
(58) Field of Classification Search .......... 257/396–399, 257/303, 306–310, E21.008, E21.015–E21.016, 257/E21.018–E21.019; 438/303, 306–310, 438/396–399
See application file for complete search history.

(56) References Cited

U.S. PATENT DOCUMENTS

| | | | |
|---|---|---|---|
| 4,195,326 A | 3/1980 | Ruegg et al. | |
| 4,878,151 A * | 10/1989 | Gallichio | 361/329 |
| 5,208,725 A | 5/1993 | Akcasu | |
| 5,448,103 A | 9/1995 | De Wit | |
| 5,517,385 A * | 5/1996 | Galvagni et al. | 361/312 |
| 5,768,186 A | 6/1998 | Ma | |
| 6,069,050 A * | 5/2000 | Hou et al. | 438/393 |
| 6,117,732 A | 9/2000 | Chu et al. | |
| 6,303,957 B1 * | 10/2001 | Ohwa | 257/307 |
| 6,319,814 B1 | 11/2001 | Tsai et al. | |
| 6,383,858 B1 * | 5/2002 | Gupta et al. | 438/238 |
| 6,583,069 B1 * | 6/2003 | Vassiliev et al. | 438/778 |
| 6,617,637 B1 | 9/2003 | Hsu et al. | |
| 6,747,334 B2 | 6/2004 | Kitagawa et al. | |
| 6,818,936 B2 | 11/2004 | Lin et al. | |
| 6,833,604 B2 | 12/2004 | Tsau | |
| 6,836,399 B2 * | 12/2004 | Lee et al. | 361/306.1 |
| 6,842,329 B2 * | 1/2005 | Feltz et al. | 361/321.2 |
| 6,885,081 B2 * | 4/2005 | Morimoto | 257/532 |
| 6,920,067 B2 | 7/2005 | Hsu et al. | |
| 7,037,845 B2 | 5/2006 | Brask et al. | |

(Continued)

FOREIGN PATENT DOCUMENTS
WO    WO 01/18830 A1    3/2001

OTHER PUBLICATIONS

Lee, et al., "High-Density Single-Poly Electrically Erasable Programmable Logic Device for Embedded Nonvolatile Memory Applications," Japanese Journal of Applied Physics, 2005, pp. 44-49, vol. 44, No. IA.

*Primary Examiner* — Matthew W Such
(74) *Attorney, Agent, or Firm* — Slater & Matsil, L.L.P.

(57) ABSTRACT

Structures and methods of forming an ideal MIM capacitor are disclosed. The single capacitor includes a first and a second metal structure overlying a substrate, a first dielectric material disposed between a first portion of the first metal structure and a first portion of the second metal structure. A second dielectric material is disposed between a second portion of the first metal structure and a second portion of the second metal structure. No first dielectric material is disposed between the second portion of the first and second metal structures, and no second dielectric material is disposed between the first portion of the first and second metal structures. The first and second dielectric material layers include materials with opposite coefficient of capacitance.

26 Claims, 25 Drawing Sheets

U.S. PATENT DOCUMENTS

| | | | |
|---|---|---|---|
| 7,041,569 B1 * | 5/2006 | Kar-Roy et al. | 438/396 |
| 7,050,290 B2 * | 5/2006 | Tang et al. | 361/312 |
| 7,126,809 B2 | 10/2006 | Iioka et al. | |
| 7,195,971 B2 | 3/2007 | Bernstein et al. | |
| 7,598,592 B2 * | 10/2009 | Chen et al. | 257/534 |
| 7,763,923 B2 | 7/2010 | Yeh et al. | |
| 2006/0001068 A1 * | 1/2006 | Mosley et al. | 257/306 |
| 2006/0024905 A1 * | 2/2006 | He et al. | 438/396 |
| 2006/0125048 A1 | 6/2006 | Miki | |

* cited by examiner

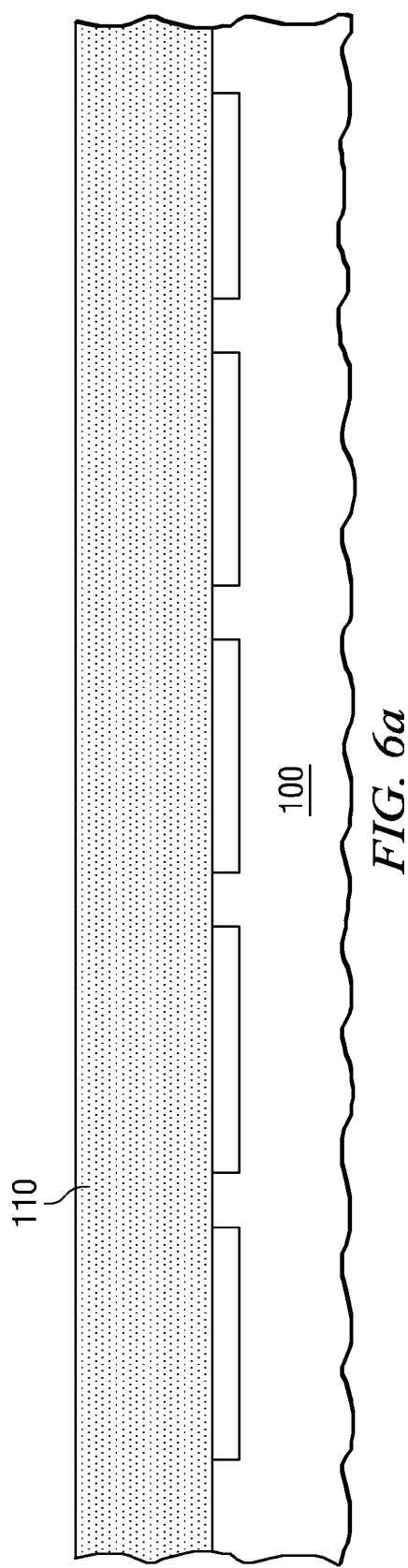
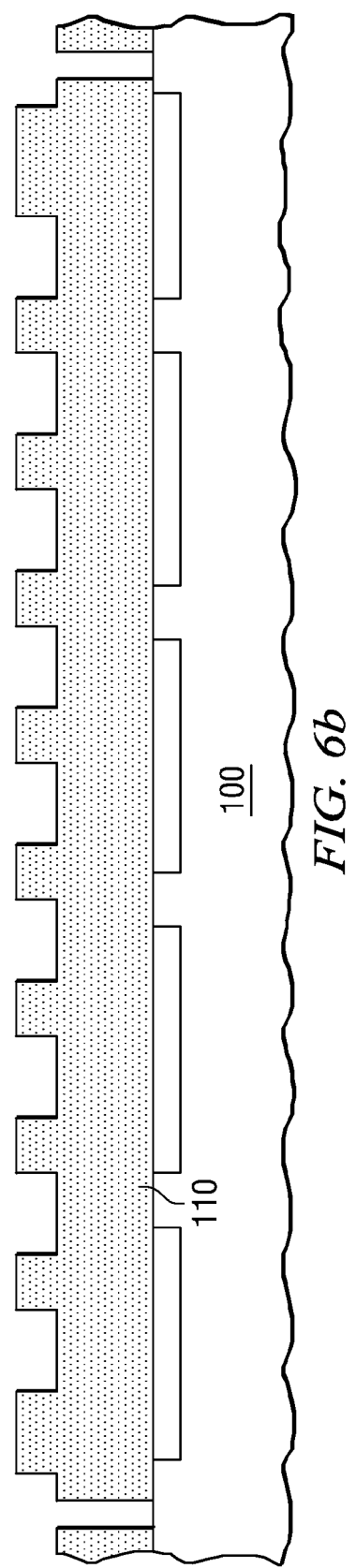

MIM CAPACITORS IN SEMICONDUCTOR COMPONENTS

TECHNICAL FIELD

This invention relates generally to electronic devices and, more particularly, to MIM capacitors in semiconductor components.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

There is a demand in semiconductor device technology to integrate many different functions on a single chip, e.g., manufacturing analog and digital circuitry on the same die. In such applications, large capacitors are extensively used for storing an electric charge. They are rather large in size, being several hundred micrometers wide depending on the capacitance, which is much larger than a transistor or memory cell. Consequently, such large capacitors occupy valuable silicon area, increasing product cost. Such large capacitors are typically used as decoupling capacitors for microprocessor units (MPU's), RF capacitors in high frequency circuits, and filter and analog capacitors in mixed-signal products. Key attributes of MIM capacitors are high linearity over broad voltage ranges (low voltage coefficients), low series resistance, good matching properties, small temperature coefficients of capacitance, low leakage currents, high breakdown voltage and sufficient dielectric reliability.

For economic reasons, a large number of parasitic MIM capacitors are built in the back end of the line process during metallization. As these are parasitic capacitors, they share a common process flow with the baseline processes. Consequently, these capacitors are disposed in low-k dielectric layers as low-k dielectrics are used above active devices to minimize interconnect parasitic capacitance. However, introduction of low-k materials introduces a number of challenges for the design of MIM capacitors. For example, the capacitance of the MIM capacitors may change due to drift in dielectric constant of the dielectrics, the dielectric constant drifting either with temperature or applied stress (voltage). However, a number of applications require precision MIM capacitors immune from environmental or operating variability.

Thus, what are needed in the art are MIM capacitors that are immune from environmental and/or operating conditions, and fabricated at a minimal cost.

SUMMARY OF THE INVENTION

These and other problems are generally solved or circumvented, and technical advantages are generally achieved, by embodiments of the present invention.

Embodiments of the invention include methods and structures for forming ideal MIM capacitors. In accordance with an embodiment of the present invention, the capacitor comprises a first metal structure and a second metal structure overlying a substrate, a first dielectric material disposed between a first portion of the first metal structure and a first portion of the second metal structure. A second dielectric material is disposed between a second portion of the first metal structure and a second portion of the second metal structure. No first dielectric material is disposed between the second portion of the first metal structure and the second portion of the second metal structure, and no second dielectric material is disposed between the first portion of the first metal structure and the first portion of the second metal structure. The first metal structure, the second metal structure, the first dielectric material, and the second dielectric material are configured to form a single capacitor. The first and the second dielectric material layer comprise materials with opposite coefficient of capacitance.

The foregoing has outlined rather broadly the features of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1a and 1b, illustrates an embodiment of a chip with an ideal MIM capacitor, wherein FIG. 1a illustrates a cross sectional view of the chip illustrating the capacitor and FIG. 1b illustrates a top view of a portion of the capacitor illustrated in FIG. 1a;

FIG. 2, which includes FIGS. 2a-2d, illustrates an embodiment for designing the capacitor, in accordance with embodiments of the invention, wherein FIGS. 2a and 2b illustrate the variation of the capacitance of the capacitor with respect to temperature and FIGS. 2c and 2d illustrate the variation of the capacitance of the capacitor with applied voltage;

FIG. 3, which includes FIG. 3a-3d, illustrates embodiments of the ideal MIM capacitor, wherein FIG. 3a illustrates a capacitor with alternating layers of different material layers, wherein FIG. 3b illustrates a capacitor wherein the inner and outer dielectric layers of the capacitor are different, wherein FIG. 3c illustrates a capacitor wherein a portion of the dielectric layer comprises a different dielectric material, and wherein FIG. 3d illustrates a capacitor comprising a multi-finger structure in which the finger structure in each level of a metal level is laterally displaced relative to the finger structure below, creating horizontal and vertical capacitive coupling;

FIG. 4, which includes FIGS. 4a and 4b, illustrates an embodiment of a chip with an ideal MIM capacitor, wherein FIG. 4a illustrates a cross sectional view of the chip illustrating the capacitor, FIG. 4b illustrates a top view of a portion of the capacitor illustrated in FIG. 4a;

FIG. 5, which includes

FIG. 6, which includes FIGS. 6a-6h, illustrates a method of fabrication of the MIM capacitor in various stages of fabrication, in accordance with embodiments of the invention;

FIG. 8, which includes

FIG. 10, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
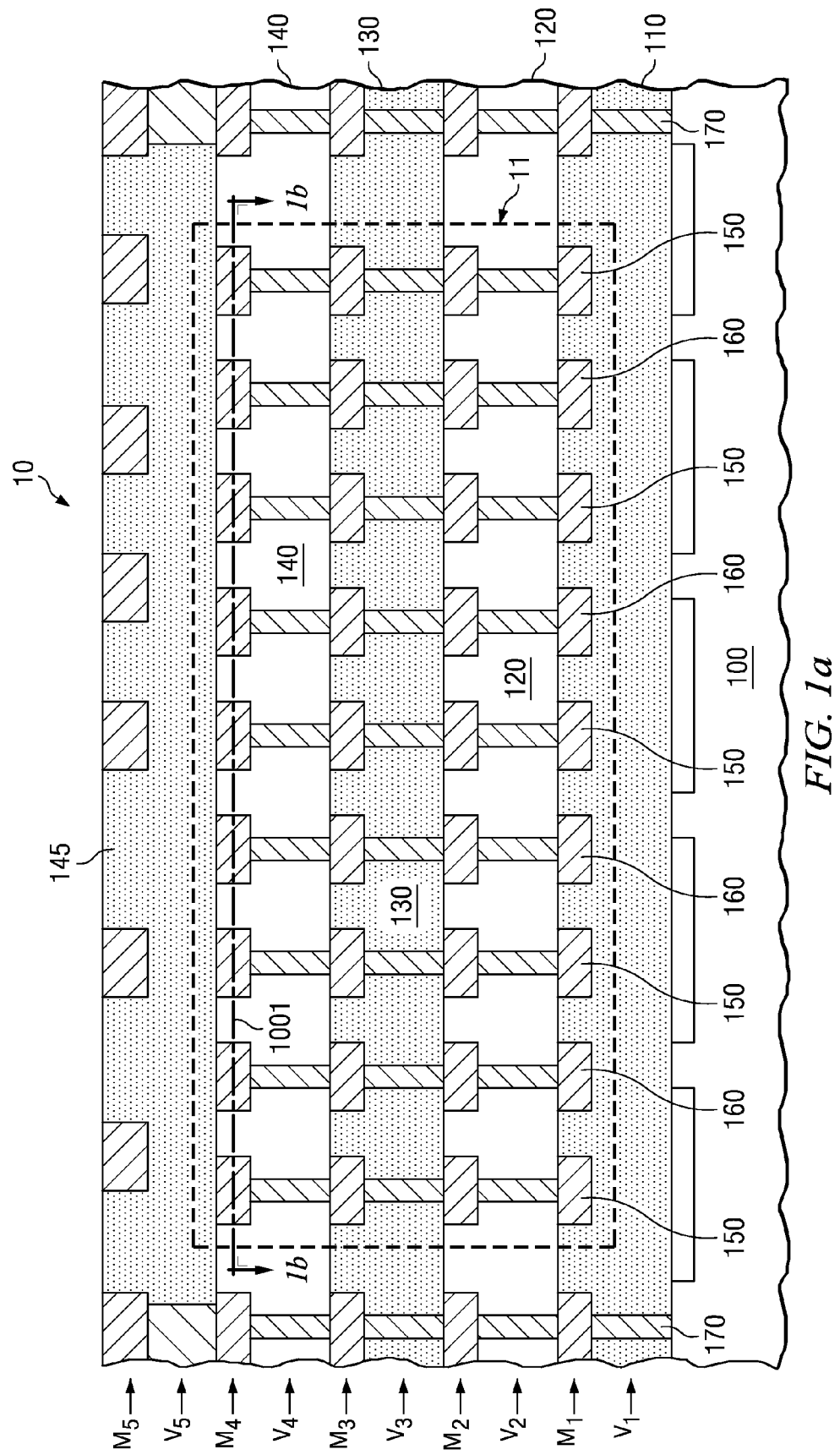

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a structure and method for forming an ideal MIM capacitor. The MIM capacitor comprises a low voltage coefficient and a small temperature coefficient, and may be used in a number of semiconductor components that require a precision capacitor immune from environmental and/or operating conditions.

MIM capacitors are used as decoupling capacitors in MPUs (e.g., to reduce the transient currents across the on-chip voltage/ground-interconnects and the chip-to-package interconnects during the switching cycles of the CMOS circuits). In high frequency oscillator and resonator circuits and in matching networks, MIM capacitors comprising RF coupling and RF bypass capacitors are commonly used. Filter and analog capacitors are used in high performance mixed-signal products (e.g., A/D or D/A converters). MIM capacitors are also used as storage capacitors in DRAM and embedded DRAM/logic devices. Examples of components fabricated with MIM capacitors include system on chip (SoC), microprocessor units (MPU's), high frequency circuits, and mixed-signal products.

Such applications require MIM capacitors to be fabricated with low voltage coefficients or high linearity over a broad voltage range. Similarly, MIM capacitors with a small temperature coefficient or a small temperature dependence are needed. Hence, capacitors with an ideal coefficient of capacitance are needed, wherein the coefficient of capacitance is defined as the variation in capacitance of the capacitor with a corresponding variation in an operating parameter. For example, the variation in capacitance of a capacitor with a change in temperature is defined as the temperature coefficient of capacitance (TCC), and a variation in capacitance of a capacitor with a change in voltage is defined as a voltage coefficient of capacitance (VCC). However, dielectric films, in particular low-k dielectric films, commonly used in semiconductor industry introduce a significant voltage coefficient and temperature coefficient.

In various embodiments, the present invention overcomes these limitations by combining dielectric materials with opposite characteristics. In various embodiments, the ideal MIM capacitor is formed by a combination of dielectric materials with opposite temperature coefficient of capacitance or dielectric constant. Similarly, a low VCC is obtained by the combination of dielectric materials with opposite VCC.

A structural embodiment of the invention will be first described using FIG. 1. An embodiment describing the design of the ideal MIM capacitor is described in FIG. 2. Various structural embodiments will then be described using FIGS. 3 and 4. Embodiments of the methods of fabrication will be described using FIGS. 6, 8 and 10 and the flow charts of FIGS. 5, 7, 9 and 11.

Figure 1B:
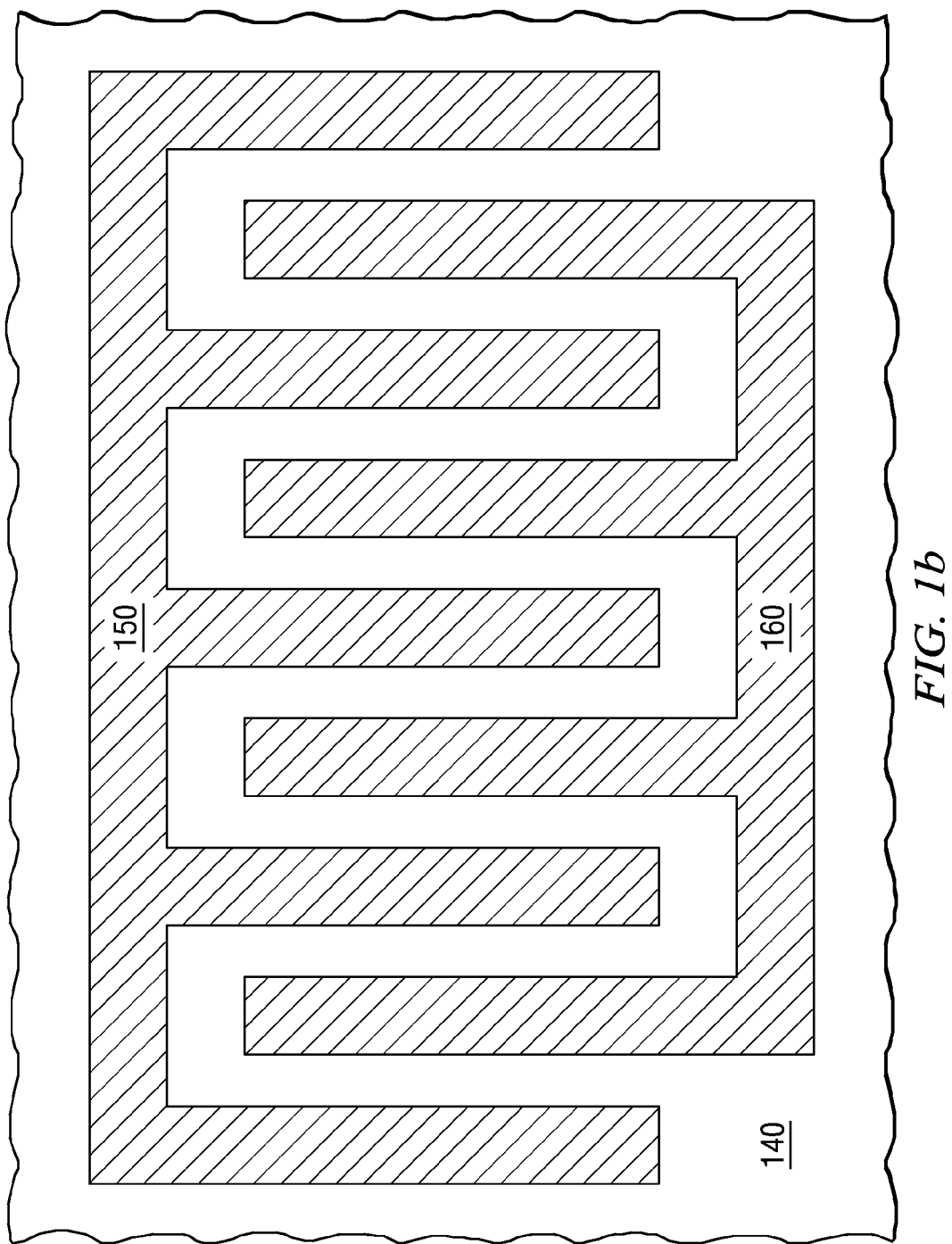

An embodiment of the invention is illustrated in FIG. 1 which includes FIG. 1*a* and 1*b*. FIG. 1*a* illustrates a cross sectional view of a MIM capacitor, FIG. 1*b* illustrates a top view of the capacitor illustrated in FIG. 1*a* by cut line 1*b*.

FIG. 1*a* illustrates a top cross sectional view of the chip 10. The chip 10 (not shown to scale) contains active circuitry disposed in a substrate 100. The active circuitry contains the active device regions and includes necessary transistors, resistors, capacitors, inductors or other components used to form integrated circuits. For example, active areas that include transistors (e.g., CMOS transistors) can be separated from one another by isolation regions (e.g., shallow trench isolation).

Next, metallization is formed over the active device regions to electrically contact and interconnect the active devices. The metallization and active device regions together form a completed functional integrated circuit. In other words, the electrical functions of the chip 10 can be performed by the interconnected active circuitry. In logic devices, the metallization may include many layers, e.g., nine or more, of copper or alternatively of other metals. In memory devices, such as DRAMs, the number of metal levels may be less and may be aluminum.

Referring to FIG. 1*a*, the chip 10 comprises capacitor structures over the substrate 100. A horizontal capacitor 11 (wherein the plates are horizontally aligned) is illustrated in FIG. 1*a*. The capacitor 11 comprises an outer plate 150 and an inner plate 160 interlaced together forming a capacitor structure. The outer and inner plates 150 and 160 comprise many levels of metal levels disposed between seal rings 170. The inner and outer plates 160 and 150 comprise pillars or pillar structures, the pillars comprising combinations of metal lines and vias over one or more metal levels. In FIG. 1*a*, five metal levels comprising $ML_1$, $ML_2$, $ML_3$, $ML_4$, and $ML_5$ are stacked vertically, and comprise metal lines $M_1$, $M_2$, $M_3$, $M_4$, and $M_5$ connected by via levels $V_1$, $V_2$, $V_3$, $V_4$, and $V_5$. In other embodiments, more or less number of metal and via levels may be used. In FIG. 1*a*, the outer and inner plates 150 and 160 are disposed inside the first four levels of metal levels ($ML_1$-$ML_4$).

A first dielectric layer 110 is disposed over a substrate 100. A first segment of the capacitor structure comprising first metal lines $M_1$ and a first via level $V_1$, forming a part of the outer and inner plates 150 and 160, is disposed in the first dielectric layer 110. A second segment of the capacitor structure comprising second metal lines $M_2$ and a second via level $V_2$, forming a part of the outer and inner plates 150 and 160 is disposed in the second dielectric layer 120. A third segment of the capacitor structure comprising third metal lines $M_3$ and a third via level $V_3$ is disposed in the third dielectric layer 130. Finally, a fourth segment of the capacitor structure comprising fourth metal lines $M_4$ and a fourth via level $V_4$ is disposed in the fourth dielectric layer 140. An optional etch stop liner is present between the dielectric layers (not shown).

In preferred embodiments, the first and third dielectric layers 110 and 130 comprise fluorinated silicon glass (FSG), and the second and fourth dielectric layers 120 and 140 comprise un-doped silicon glass (USG). In an alternate embodiment, the first and third dielectric layers 110 and 130 comprise USG, and second and fourth dielectric layers 120 and 140 comprise FSG.

A fifth metal level $M_5$, comprising a fifth dielectric layer 145, is disposed above the fourth dielectric layer 140 and may comprise additional metal lines not connected with the capacitor 11.

The first, second, third and fourth dielectric layers 110, 120, 130 and 140 comprise a material selected from the group comprising FSG, carbon doped glass (such as Black Diamond™, Coral™, Aurora™), organo silicate glass (OSG), hydrogen doped glass, porous carbon doped glass, porous silicon dioxide, polymeric dielectrics (e.g., FLARE™, SILK™), F-doped amorphous carbon, silicone based polymeric dielectrics such as hydrogen silsesquioxane (HSQ) and methylsilsesquioxane (MSQ) as well as other ultra low-k materials such as porous silicate glass, xerogel, aerogel, nano clustered silica (NCS), porous organo silicate glass and porous organics. In various embodiments, the first, second, third and fourth dielectric layers 110, 120, 130 and 140 may comprise insulating materials typically used in semiconductor manufacturing for inter-level dielectric (ILD) layers. The ILD may comprise a thickness of about 500 nm or less, for example, although alternatively, the ILD may comprise other dimensions.

In various embodiments, the first, second, third and fourth dielectric layers 110, 120, 130 and 140 comprise a high-k dielectric material.

The pitch (distance between individual vias) is controlled by the minimum allowed spacing defined for the particular technology. To maximize capacitive coupling, the pitch between the metal lines is at this minimum allowed spacing. The vias ($V_1$-$V_5$) comprise an outer conductive liner and a core comprising a conductive material. The inner core of the metal lines comprises a conductive material and an outer conductive liner to minimize out diffusion of the conductive material during subsequent thermal processing. The conductive material comprises copper although some embodiments may comprise aluminum, tungsten, silver, gold, or other conductive materials. The outer conductive liner comprises a diffusion barrier metal such as titanium nitride, titanium, tantalum, tantalum nitride, tungsten nitride, tungsten carbonitride (WCN), ruthenium or other suitable conductive nitrides or oxides. The vias comprise a copper core with an outer liner preferably of tantalum nitride and tantalum, although in some embodiments the vias comprise tungsten and outer liners of titanium and titanium nitride or other metal liners or liner combinations.

In the capacitor plates the contacts, or vias $V_1$, $V_2$, $V_3$, $V_4$ and $V_5$, are designed preferably as uninterrupted lines or trenches in the minimum dimensions of the respective via level. However, other design variants, like arrays of rectangular, square or circular or elongated vias, may also be used at least in parts of the capacitor structure. The via structures mentioned above may alternatively use larger dimensions than the minimum dimensions of the respective levels.

A top view of the capacitor 11 along the line 1b in FIG. 1a is illustrated in FIG. 1b. The capacitor 11 is disposed in the fourth dielectric layer 140 and comprises the outer plate 150 and the inner plate 160 interlaced together in a finger structure.

Figure 2A:
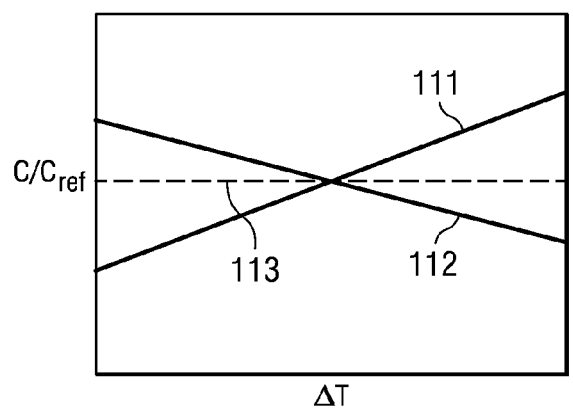
Figure 2B:
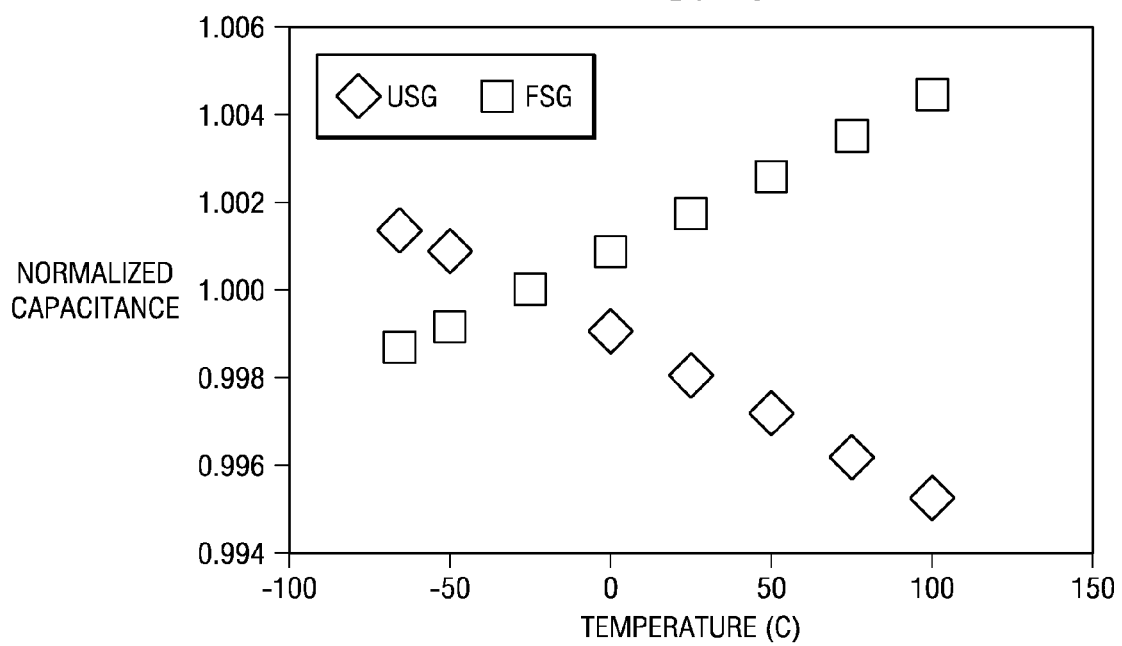

An embodiment describing the design of the MIM capacitor is illustrated in FIG. 2, which includes FIGS. 2a and 2b.

In various embodiments, the dielectric layers separating the inner and outer plates 150 and 160 comprise at least two different dielectric materials. In one embodiment, some of the dielectric layers comprise a first dielectric material and the remaining dielectric layers comprise a second dielectric material. For example, if the first and third dielectric layers 110 and 130 comprise the first dielectric material, the second and fourth dielectric layers 120 and 140 the second dielectric material. The first and second dielectric materials comprise materials that behave oppositely when subjected to thermal or voltage stress. For example, in one embodiment, the first dielectric material expands more than the substrate when heated whereas the second dielectric material expands less than the substrate when heated.

Similarly, in one embodiment, the dielectric constant of the first dielectric material increases when heated whereas the dielectric constant of the second dielectric material decreases upon heating. Although preferable, it is not necessary for the first and second dielectric materials to comprise the same variation. For example, the difference in magnitude can be compensated by changing the area of the capacitance in the first dielectric material to the second dielectric material. This can be accomplished, for example, by increasing the thickness of the layer. For example, the change in capacitance via the first dielectric material ($\Delta C_1$) is proportional to area of the capacitor ($A_1$) and the change in the dielectric constant of the first dielectric material ($\kappa_1 \alpha_1 \Delta T$), where $\kappa_1$ is the dielectric constant of the first dielectric material and $\alpha_1$ is a thermal coefficient of dielectric constant of the first dielectric material. Similarly, the change in capacitance via the second dielectric material ($\Delta C_2$) is proportional to the area of the capacitor ($A_2$) and the change in the dielectric constant of the second dielectric material ($\kappa_2 \alpha_2 \Delta T$), where $\kappa_2$ is the dielectric constant of the second dielectric material and $\alpha_2$ is a thermal coefficient of dielectric constant of the second dielectric material. Hence, an ideal capacitor with no variation is fabricated if the change in capacitance are matched, i.e., $\Delta C_1 = \Delta C_2$. Thus, given a material choice for the dielectric materials, the areal ratio of the capacitors is optimized to correspond to $A_1/A_2 = -(\kappa_1 \alpha_1)/(\kappa_2 \alpha_2)$. In various embodiments, the only requirement is that the thermal coefficients ($\alpha_1$ and $\alpha_2$) have opposite signs. Materials with positive thermal coefficient of dielectric constant include FSG, $Ta_2O_5$, $Al_2O_3$, SiN, and combinations thereof. Materials with negative thermal coefficient of dielectric constant include USG.

FIG. 2a illustrates the response of capacitance to temperature variations, for capacitors built with a single dielectric material (curves 111 and 112) compared to a capacitor formed from a dielectric material comprising two material layers (curve 113). In FIG. 2a, a first dielectric constant of a first material increases with an increase in temperature resulting in an increase in capacitance (curve 111). On the contrary, a second dielectric constant of a second material decreases with an increase in temperature resulting in a decrease in capacitance as shown by curve 112. Hence, an ideal capacitor is formed by including both these dielectrics together as shown in curve 113. FIG. 2a illustrates a special condition when both materials behave in an opposite direction and magnitude, i.e., $\alpha_2 = -\alpha_1$, as described above. Examples of materials satisfying this relation include FSG (curve 111) and USG (curve 112). FIG. 2b, illustrates actual data for USG and FSG schematically described in FIG. 2a. Using the various embodiments disclosed, highly ideal capacitors with negligible temperature dependence may be fabricated. For example, capacitors with a TCC that is less than less than 10 ppm/° C. and preferably less than 1 ppm/° C. may be fabricated.

Similarly, an ideal capacitor with respect to stress voltage may be designed. The change in dielectric constant with voltage is proportional to $\kappa\gamma\Delta V^2$, where $\kappa$ is the dielectric constant and $\gamma$ is the voltage coefficient of dielectric constant. Thus, the areal ratio of the capacitors is optimized to correspond to $A_1/A_2=-(\kappa_1\gamma_1)/(\kappa_2\gamma_2)$. Materials with positive voltage coefficient of dielectric constant include FSG, $Ta_2O_5$, $Al_2O_3$, SiN, and combinations thereof. Materials with negative voltage coefficient of dielectric constant include USG.

Figure 2C:
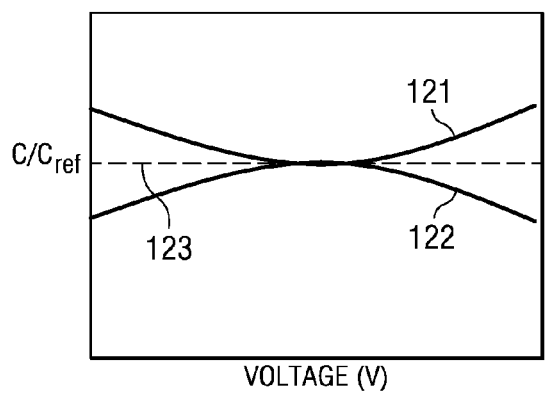
Figure 2D:
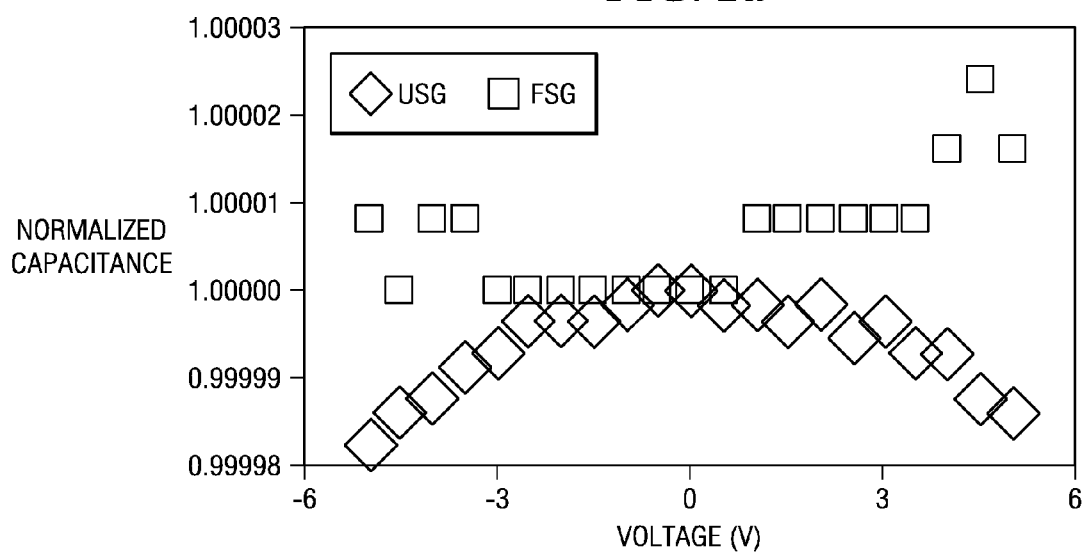

FIG. 2c illustrates a response of capacitance to voltage variations, for capacitors built with a single dielectric material (curves 121 and 122) compared to a capacitor formed from a dielectric material comprising two material layers (curve 123). In FIG. 2c, a first dielectric constant of a first material increases with increase or decrease in voltage resulting in an increase in capacitance (curve 121). On the contrary, a second dielectric constant of a second material decreases with increase or decrease in voltage resulting in a decrease in capacitance as shown by curve 122. Hence, an ideal capacitor is formed by including both these dielectrics together as shown in curve 123. FIG. 2c illustrates a special condition when both materials behave in an opposite direction and magnitude, i.e., $\gamma_2=-\gamma_1$, as described above. Examples of materials satisfying this relation include FSG (curve 121) and USG (curve 122). FIG. 2d illustrates actual data for USG and FSG schematically described in FIG. 2c. Using the various embodiments disclosed, highly ideal capacitors with negligible voltage dependence may be fabricated. For example, capacitors with VCC is less than 1 ppm/$V^2$ and preferably less than 0.25 ppm/$V^2$ may be fabricated.

Although not described, it is rather straightforward to use a similar analysis to design an ideal capacitor comprising three or more dielectric materials. In such a scenario, at least one material must have a response (to temperature or voltage) that is opposite to that of the other two materials.

In various embodiments, the ideal capacitor may be formed by attaching two or more capacitors in parallel or series. In case of parallel dual capacitors forming the ideal capacitor, the above discussion is valid. However, if two capacitors with opposite coefficient of capacitances are coupled in series, the capacitor is optimized within an operating range (e.g. temperature or voltage range). For example, the effective capacitance ($C_{eff}$) of two series capacitors results in a parabolic dependence. For a variation in temperature, this parabolic dependence is quadratic ($C_{eff} \alpha\ T^2$), the parabola comprising a maximum capacitance that deviates substantially after a certain temperature range. However, within an operating temperature the capacitance may be optimized to be near ideal.

An embodiment describing structural embodiments of the capacitor is now discussed using FIG. 3, which includes FIGS. 3a-3d.

Figure 3A:
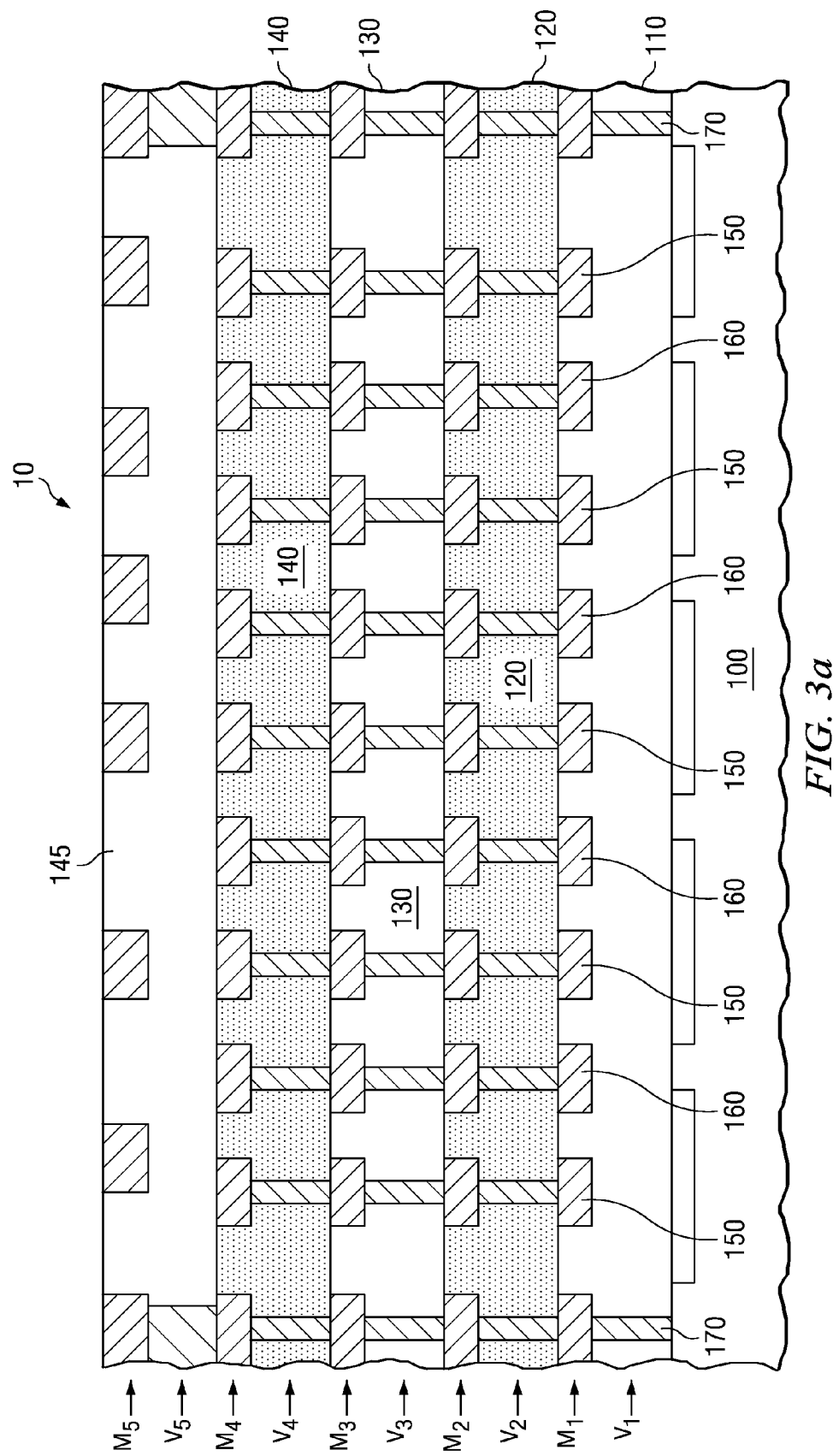

FIG. 3a, illustrates an embodiment in which the first dielectric layer 110 and third dielectric layer 130 comprise a first dielectric material, whereas the second dielectric layer 120 comprises a second dielectric material. The fourth dielectric layer 140 comprises a third dielectric material. By allowing more degrees of freedom, the three material option may be advantageous to form an ideal capacitor that is optimized for both temperature and voltage variation.

Figure 3B:
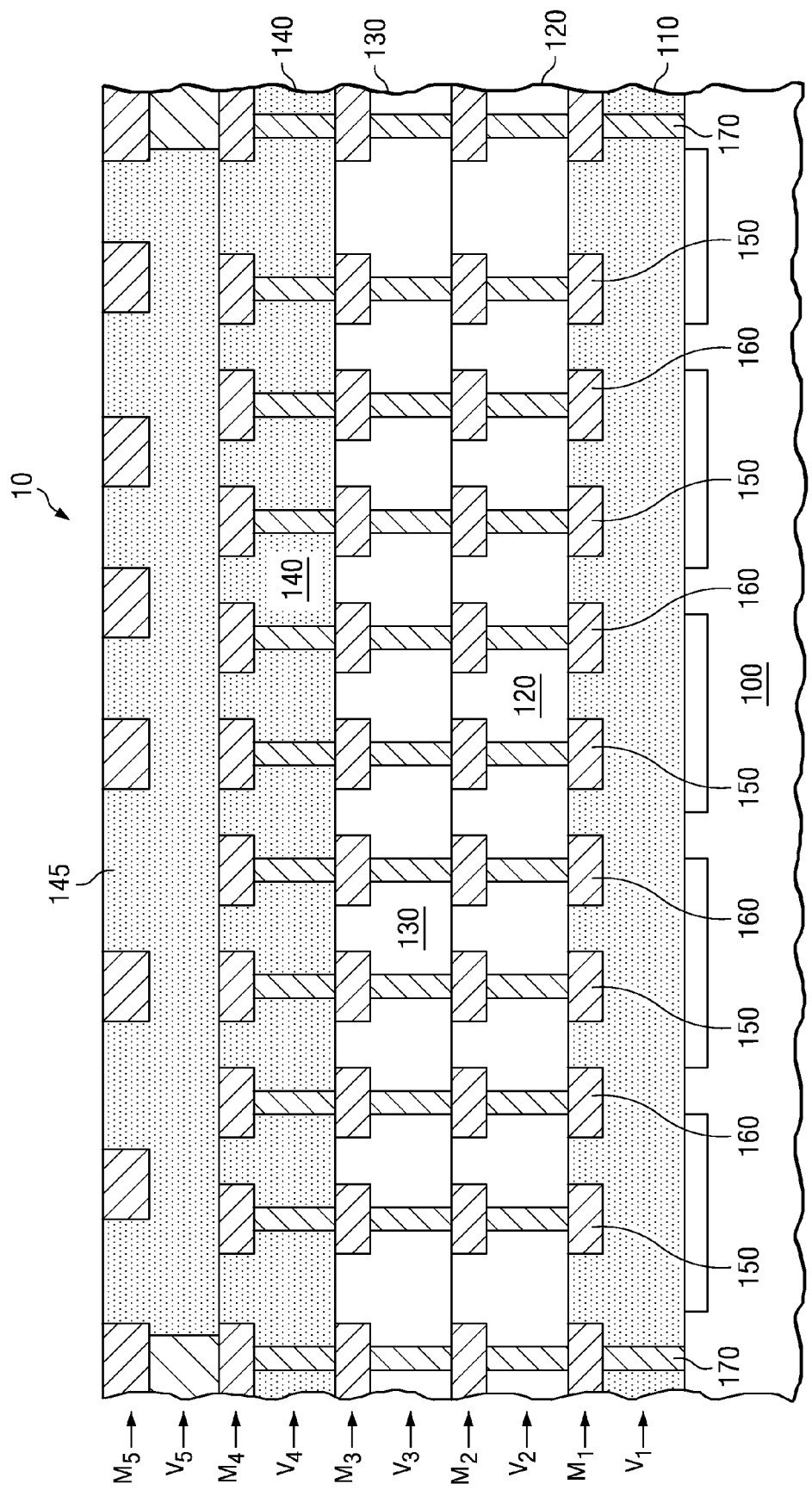

FIG. 3b illustrates an embodiment in which the first and fourth dielectric layers 110 and 140 comprise a same material layer. Similarly, the second and third dielectric layers 120 and 130 comprise a same material layer. In preferred embodiments, the first and fourth dielectric layers 110 and 140 comprise an USG and the second and third dielectric layers 120 and 130 comprise a FSG. This option reduces complexity as the number of interface (between FSG and USG layers) is reduced, thus reducing reliability issues in manufacturing.

Figure 3C:
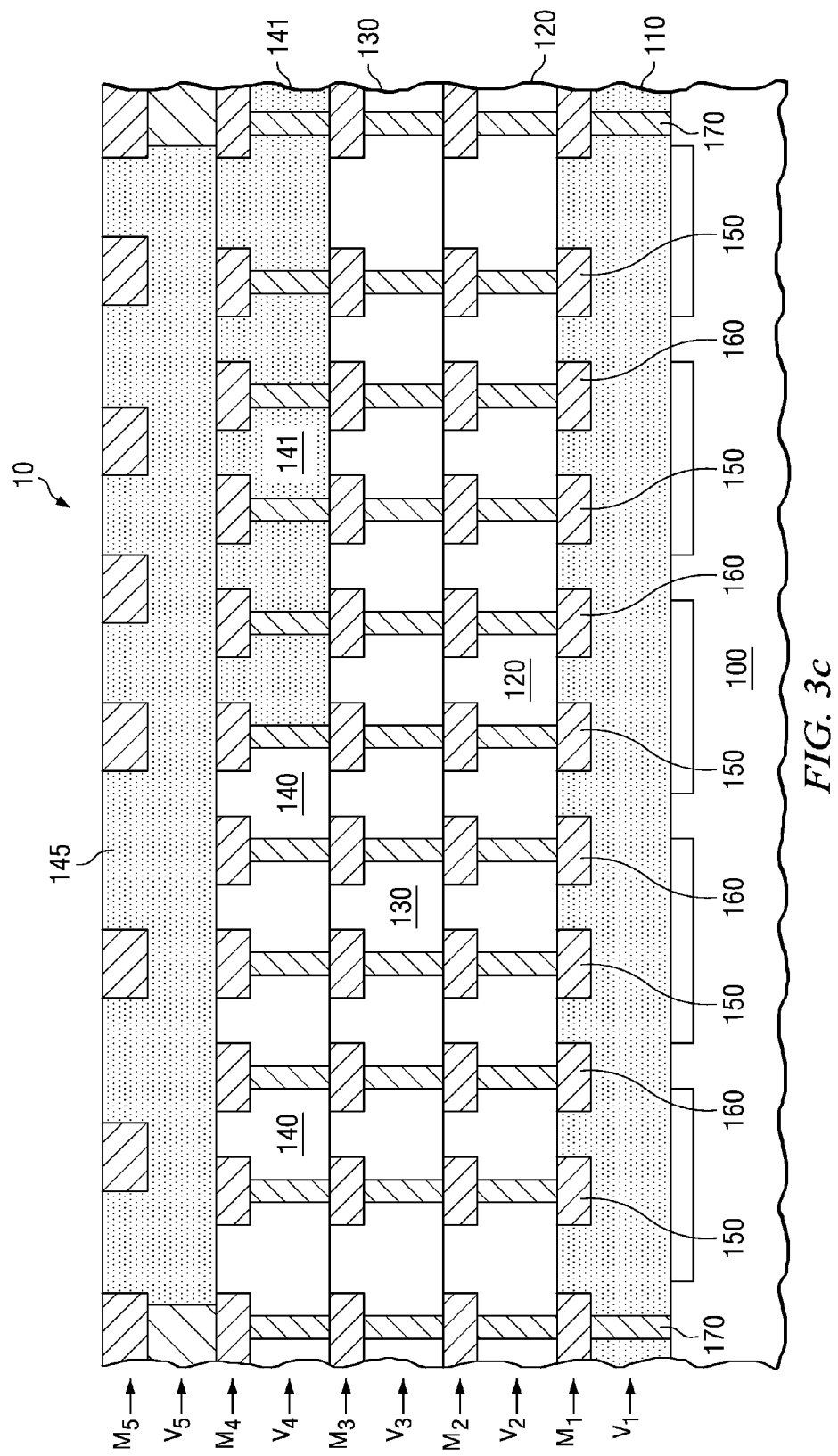

FIG. 3c illustrates an embodiment, in which only a part of the low-dielectric stack comprises a different dielectric material. In FIG. 3c, the fourth dielectric layer 140 is disposed over only a portion of the third dielectric layer 130. The first, second, third and fourth dielectric layers 110, 120, 130 and 140 comprise the same dielectric material. A sixth dielectric layer 141 is disposed above a portion of the third dielectric layer 130 and adjacent the fourth dielectric layer 140. This embodiment enables selectively tailoring the capacitor 11 with minimal changes in the process by replacing a small portion of the upper dielectric layer with a material with a significant response to temperature and/or voltage relative to the rest of the dielectric material in the first second, third and fourth dielectric layers 110, 120, 130 and 140.

Figure 3D:
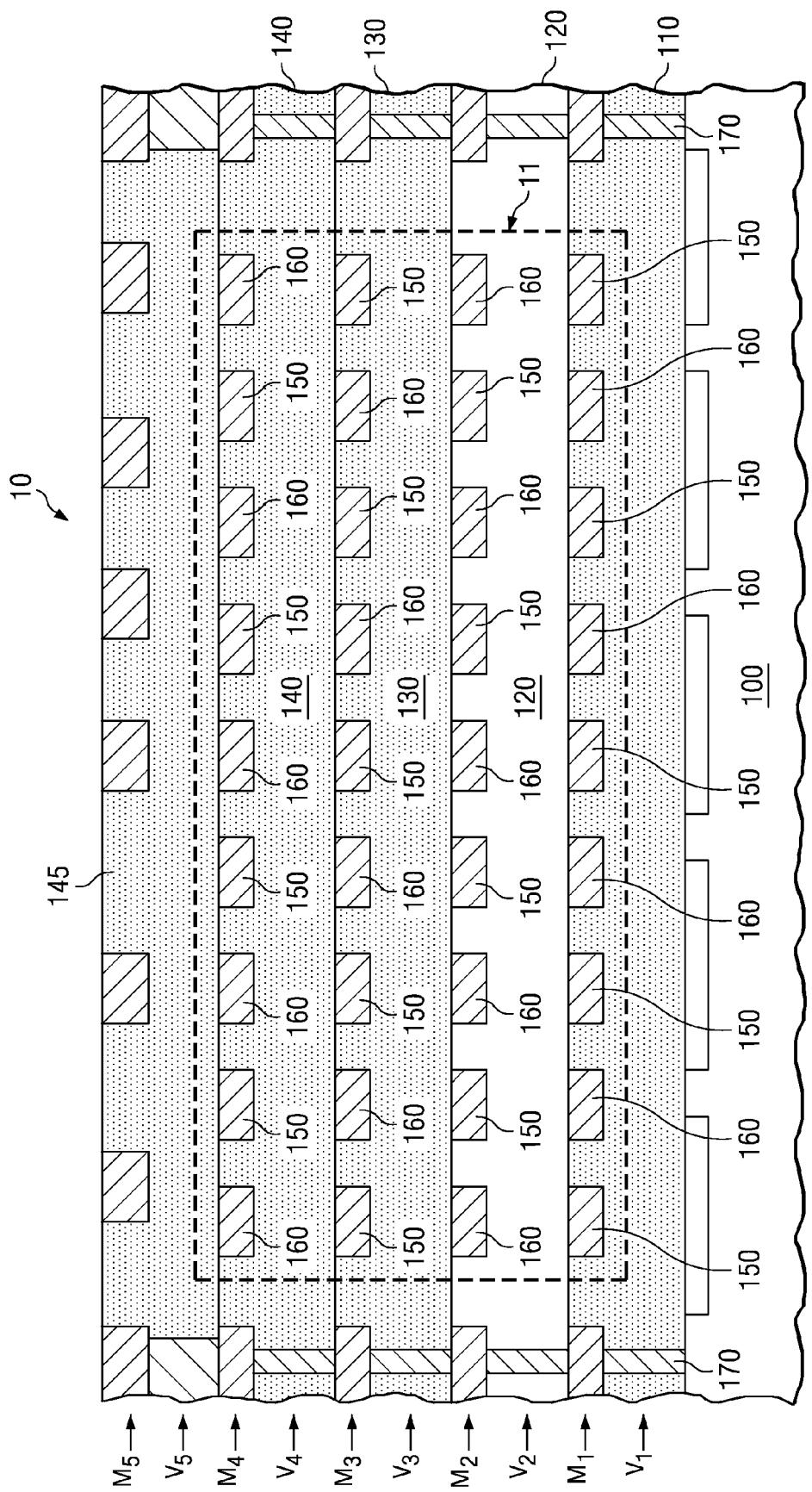

FIG. 3d illustrates an embodiment, in which includes both vertical and lateral coupling. The capacitor 11 comprises an outer plate 150 and an inner plate 160 interlaced together forming a capacitor structure. As described in FIG. 1a, in this embodiment, both the outer plate 150 and an inner plate 160 are coupled laterally through the first second, third and fourth dielectric layers 110, 120, 130 and 140. However, unlike the embodiment in FIG. 1a, the outer plate 150 and the inner plate 160 of the capacitor 11 are coupled vertically. For example, in one embodiment, this is accomplished by a lateral displacement of subsequent vertical layers of the metal lines. The subsequent layers are connected through a common region, for example, the main nerve of the finger structure.

Figure 4A:
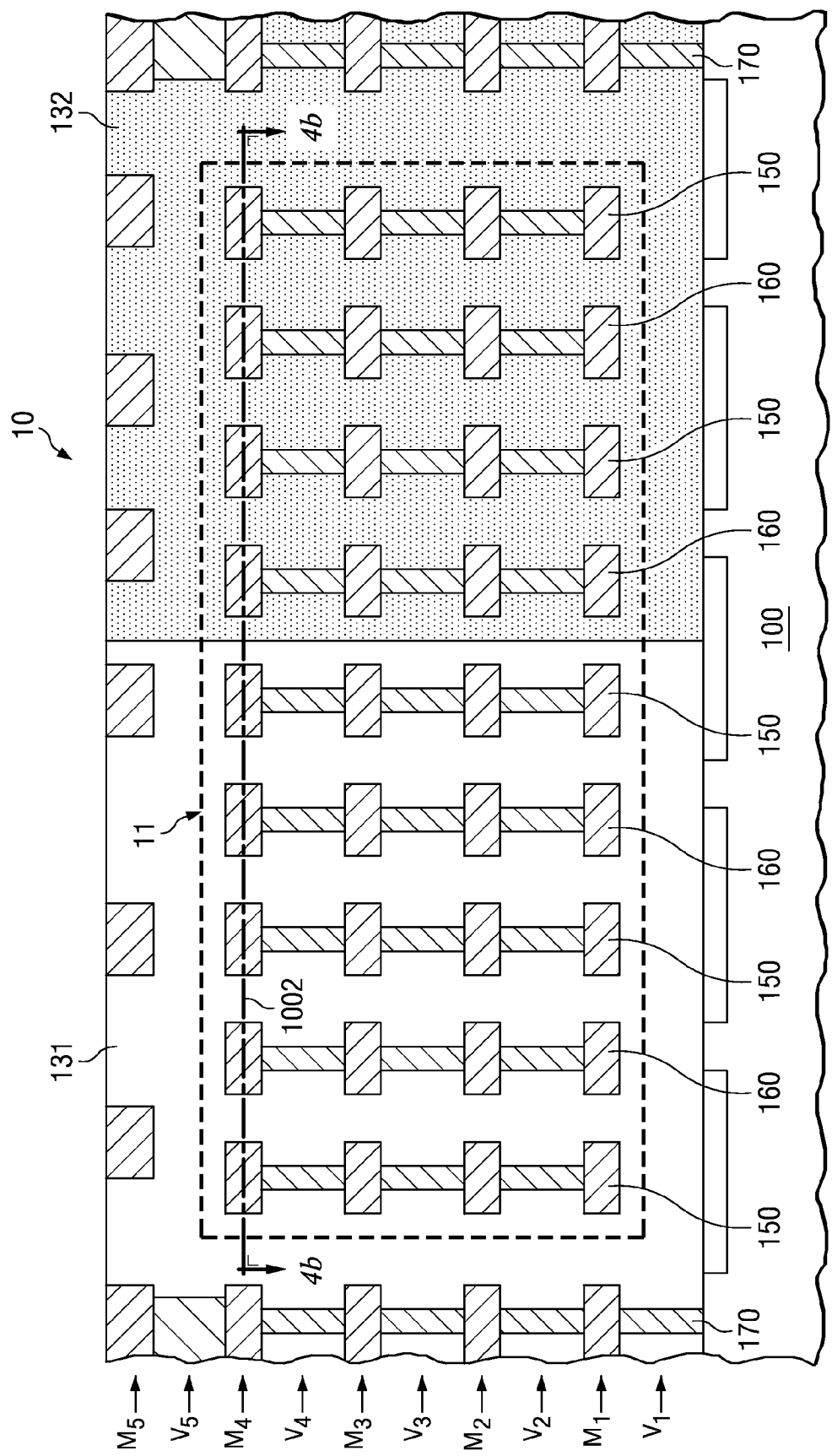
Figure 4B:
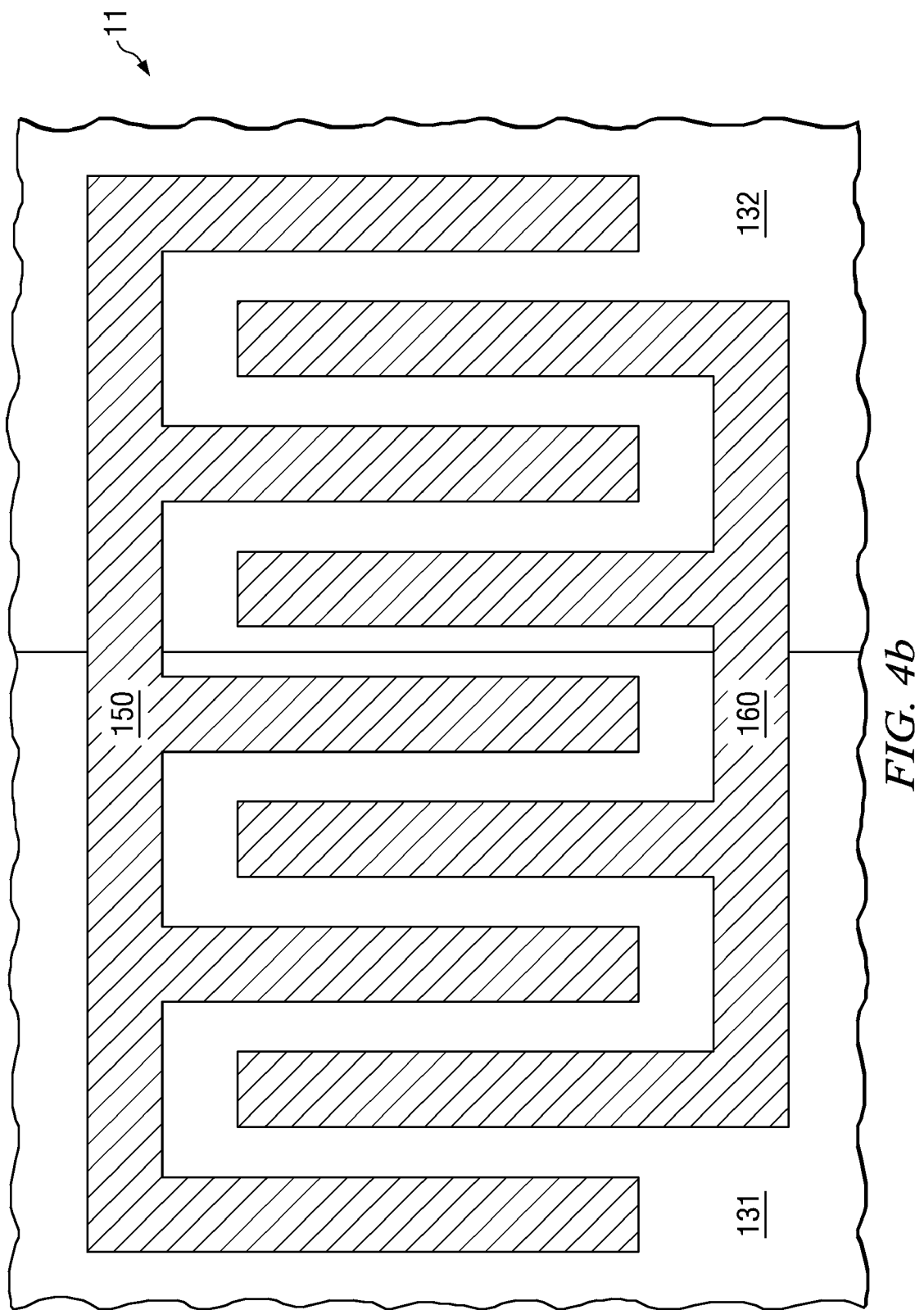

FIG. 4, which includes FIGS. 4a and 4b, illustrates another structural embodiment of the capacitor 11 comprising two dielectric materials.

FIG. 4a illustrates a cross sectional view illustrating a first dielectric material 131 and a second dielectric material 132 forming the layers of the capacitor 11. Unlike the capacitor described in FIG. 1a, the first and second dielectric materials 131 and 132 are disposed adjacent to each other. In various embodiments, the first and second dielectric materials 131 and 132 comprise multiple layers. For example, each of the first and second dielectric materials 131 and 132 may comprise multiple layers as described in FIG. 1. The first and second dielectric materials 131 and 132 also comprise additional etch stop layers disposed inside. FIG. 4b illustrates a top view of the capacitor 11 along the cut line 4b in FIG. 4a. The two capacitor fingers are interlaced forming the capacitor between each metal line. The capacitor 11 comprises an outer plate 150 and an inner plate 160 interlaced together forming a capacitor structure. Both the outer plate 150 and an inner plate 160 are coupled through the first dielectric material 131 in a first region and coupled through the second dielectric material 132 in a second region.

Figure 6C:
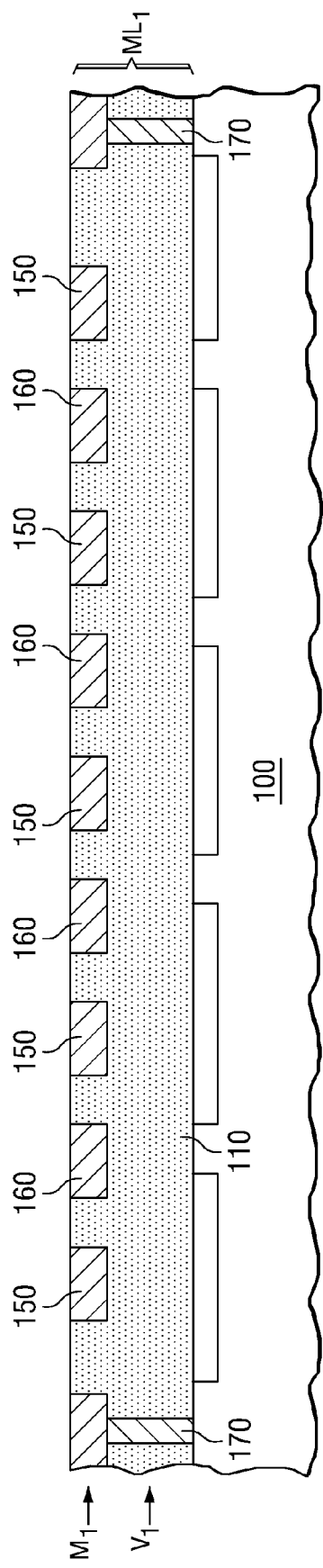
Figure 6D:
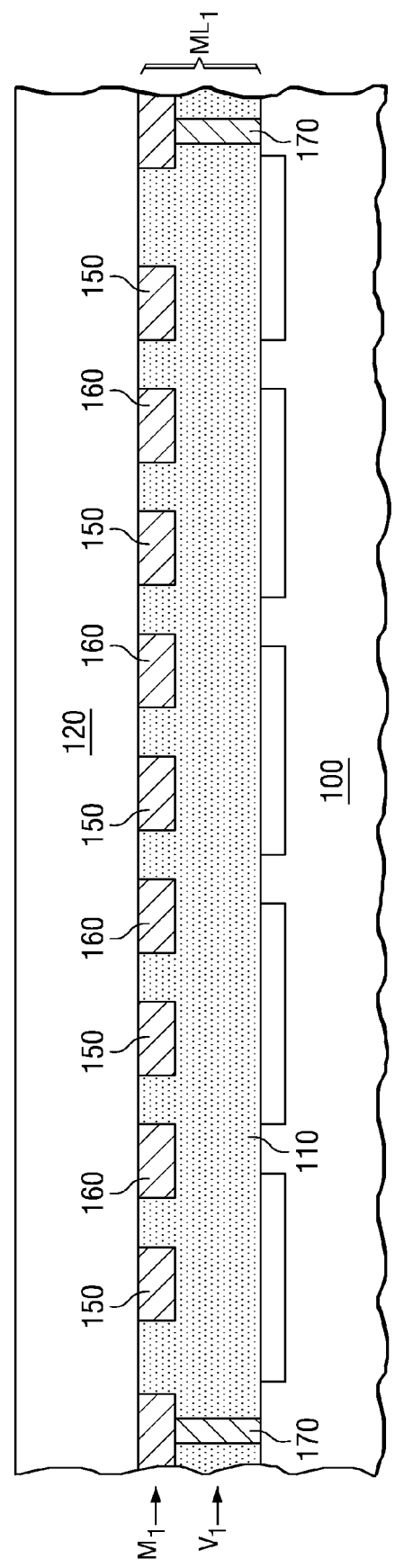
Figure 6E:
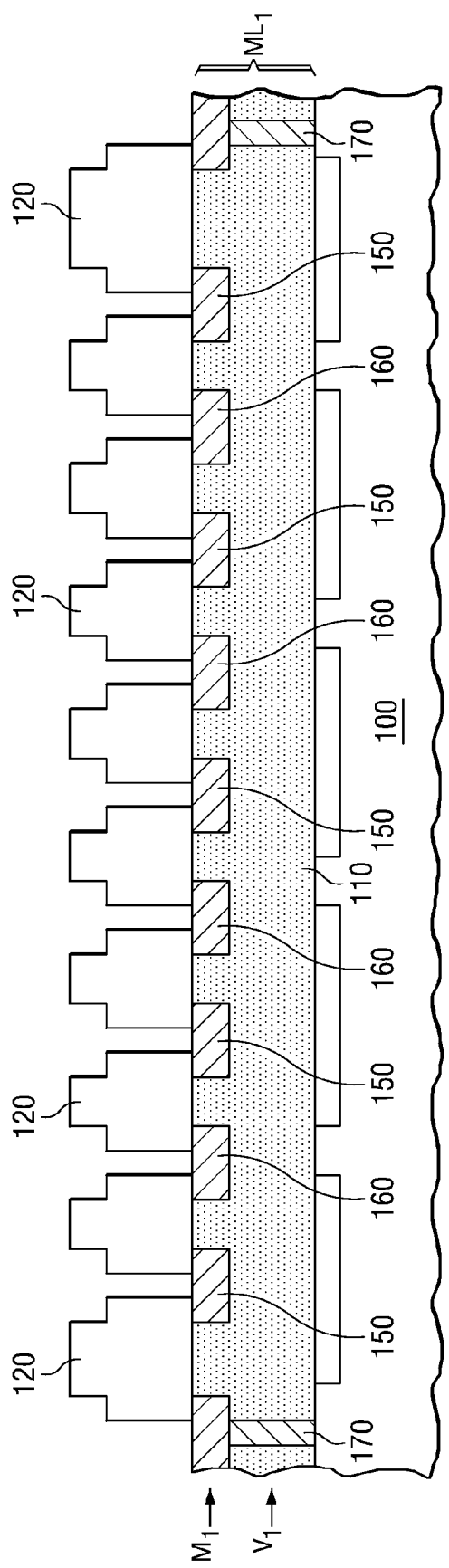
Figure 6F:
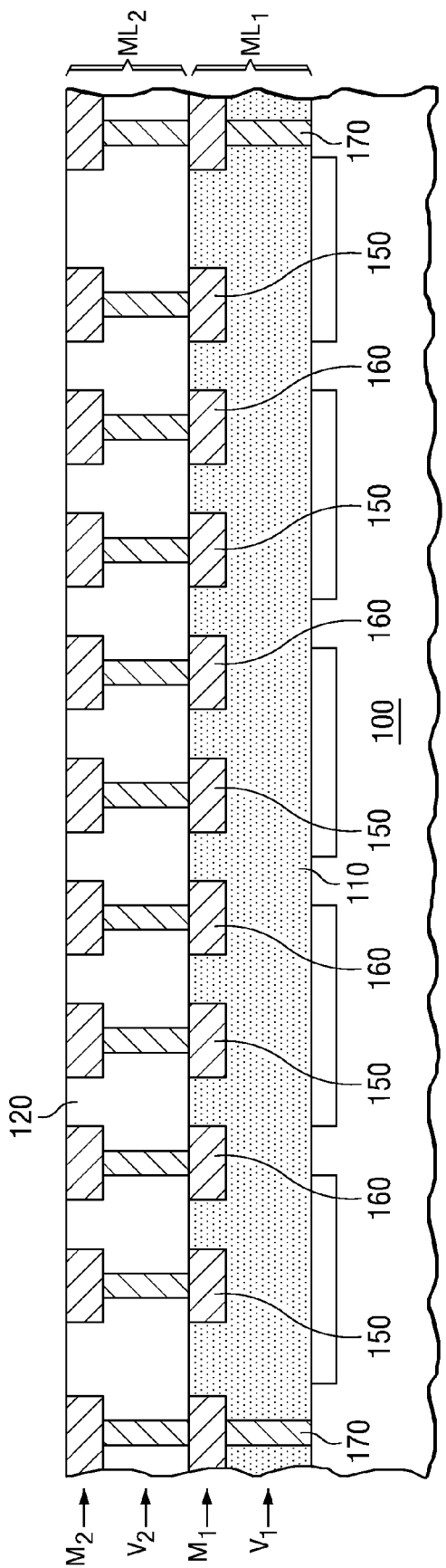
Figure 6G:
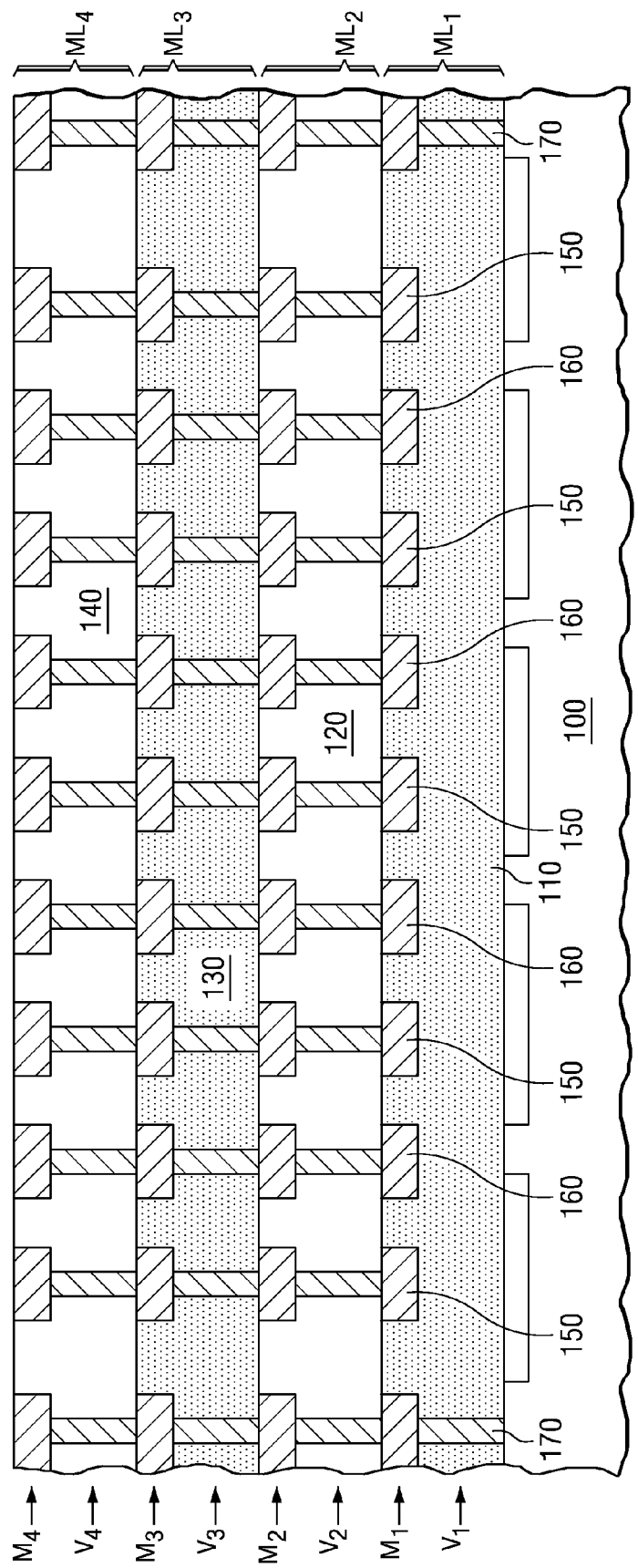
Figure 6H:
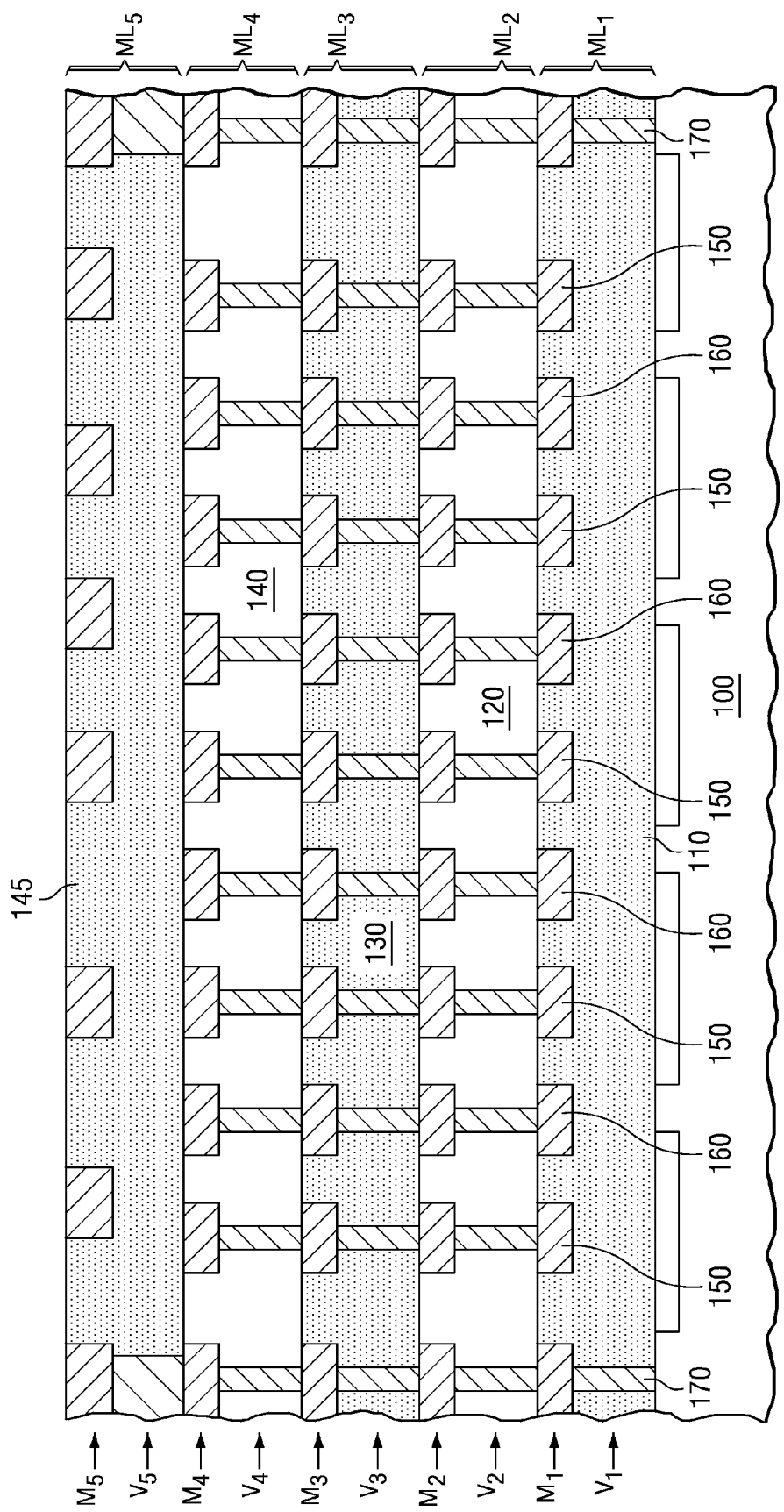
Figure 7:
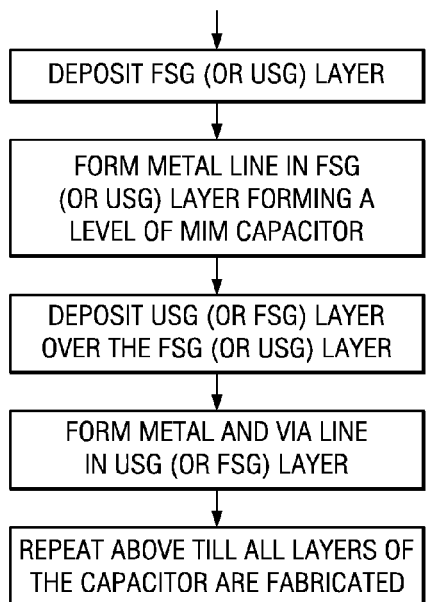
FIG. 7 illustrates a flow chart for formation of the MIM capacitor as illustrated in FIG. 6.

A method of forming the MIM capacitor is illustrated in FIG. 6 and in the flow charts of FIGS. 5 and 7, in accordance with embodiments of the invention.

In various embodiments of the invention, the metal and via levels are formed using a single damascene process or a dual damascene process. In a single damascene process, a single layer of insulating material is patterned with a pattern for conductive features, such as conductive lines, conductive vias. In contrast, in a dual damascene process, the vias and metals lines are patterned for conductive features and filled in a single fill step with a conductive material.

Figure 5A:
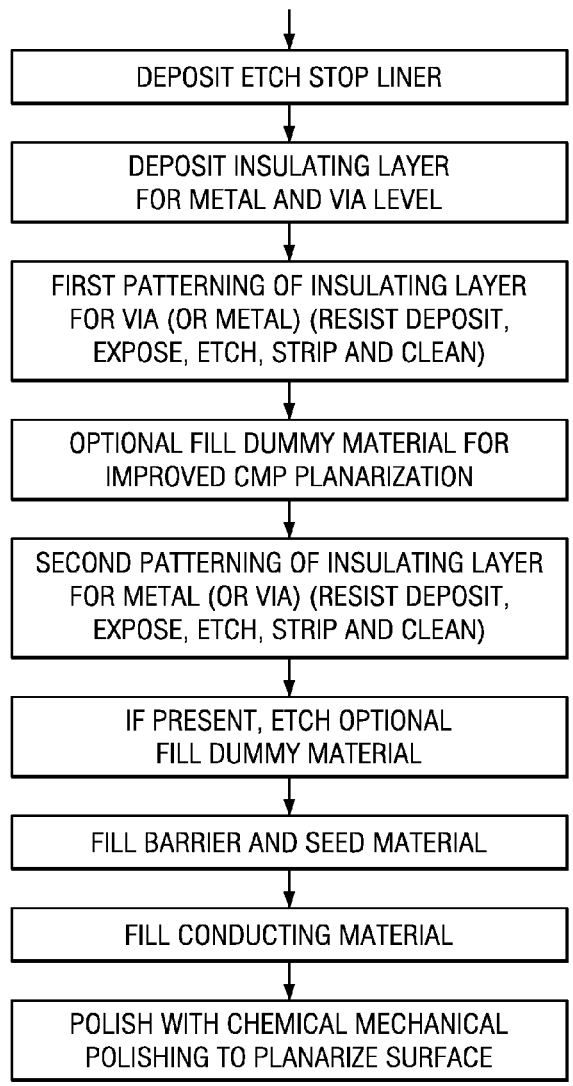
FIGS. 5a and 5b, illustrates flow charts for formation of a metal line and/or a via level of the capacitor, in accordance with embodiments of the invention.
Figure 5B:
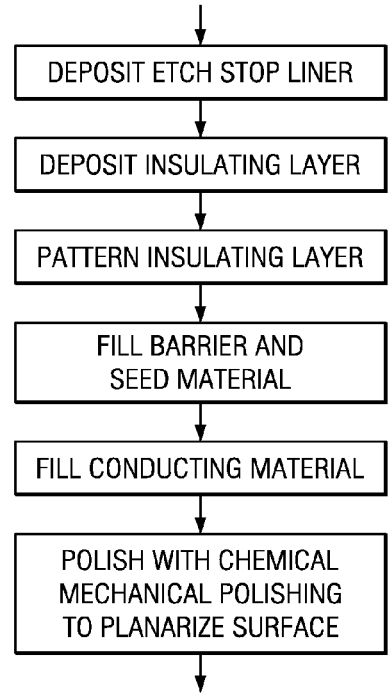

A flow chart illustrating formation of a single metal or via level using a single damascene process is illustrated in FIG. 5a. If a dual damascene process is used, a process as illustrated in flow chart in FIG. 5b is used. A typical fabrication process may use single or dual damascene processes, or combinations thereof, in building a multitude of metal and via levels.

An example of this process is illustrated in FIGS. 6a-6h for the formation of the first and second metal lines $M_1$ and $M_2$ in the first and second metal levels $ML_1$ and $ML_2$. Referring to FIG. 6a, a first dielectric layer 110 is deposited. The first dielectric layer 110 is patterned using lithography (FIG. 6b). Referring to FIG. 6c, the first metal level $M_1$ is formed above the first via level $V_1$. A conductive metal is electroplated to overfill the aperture. The overfilled conductive metal is polished using chemical mechanical polishing (CMP). FIG. 4c illustrates the formation of the metal one pattern after filling of metal and subsequent planarization such as CMP, forming first metal line $M_1$. An additional barrier layer (to prevent metal diffusion) and seed layer for electroplating are deposited before the filling of metal.

Referring to FIG. 6d, a second dielectric layer 120 is deposited over the first dielectric layer 110. The second dielectric layer 120 is patterned (FIG. 6e) and second vias $V_2$ and second metal lines $M_2$ are formed (FIG. 6f) using a dual damascene process. Similarly, third and fourth metal lines $M_3$, $M_4$ and via levels $V_3$ and $V_4$ are formed in third and fourth dielectric layers 130 and 140, as illustrated in FIG. 6g. As illustrated in FIG. 6h, a fifth metal level $ML_5$, comprising a fifth metal line $M_5$ and a fifth via level $V_5$, is formed over the fourth metal level $ML_4$. A passivation layer (not shown) is deposited after the metallization layers.

Although not shown, it is noted that the metallization processes illustrated in various embodiments used in the fabrication of the MIM capacitors are shared by the interconnect regions above active device regions.

Figure 9:
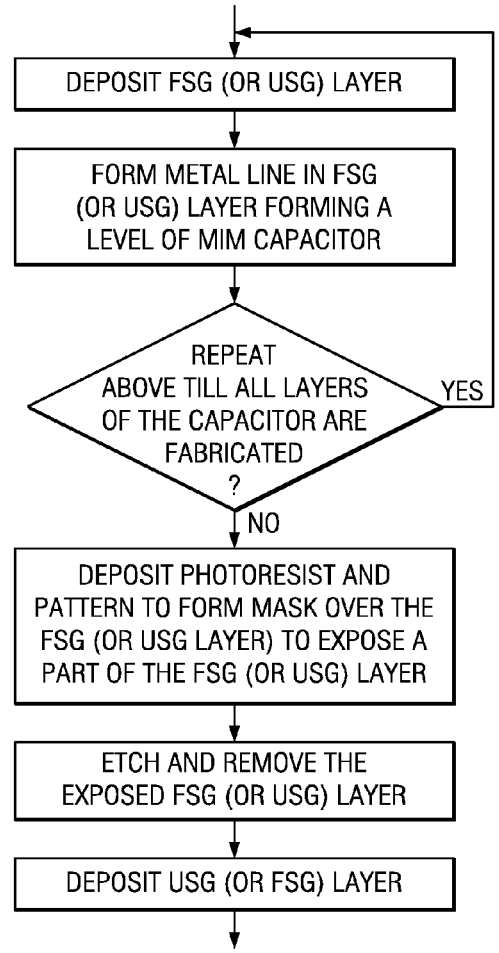
FIG. 9 illustrates a flow chart for formation of the MIM capacitor as illustrated in FIG. 8.

FIG. 8, which includes FIGS. 8a-8d, and flow chart of FIG. 9 illustrate another embodiment of the invention and illustrates the capacitor in various stages of the manufacturing. In this embodiment, additional mask steps are used to introduce flexibility in the design of the capacitor.

Figure 8A:
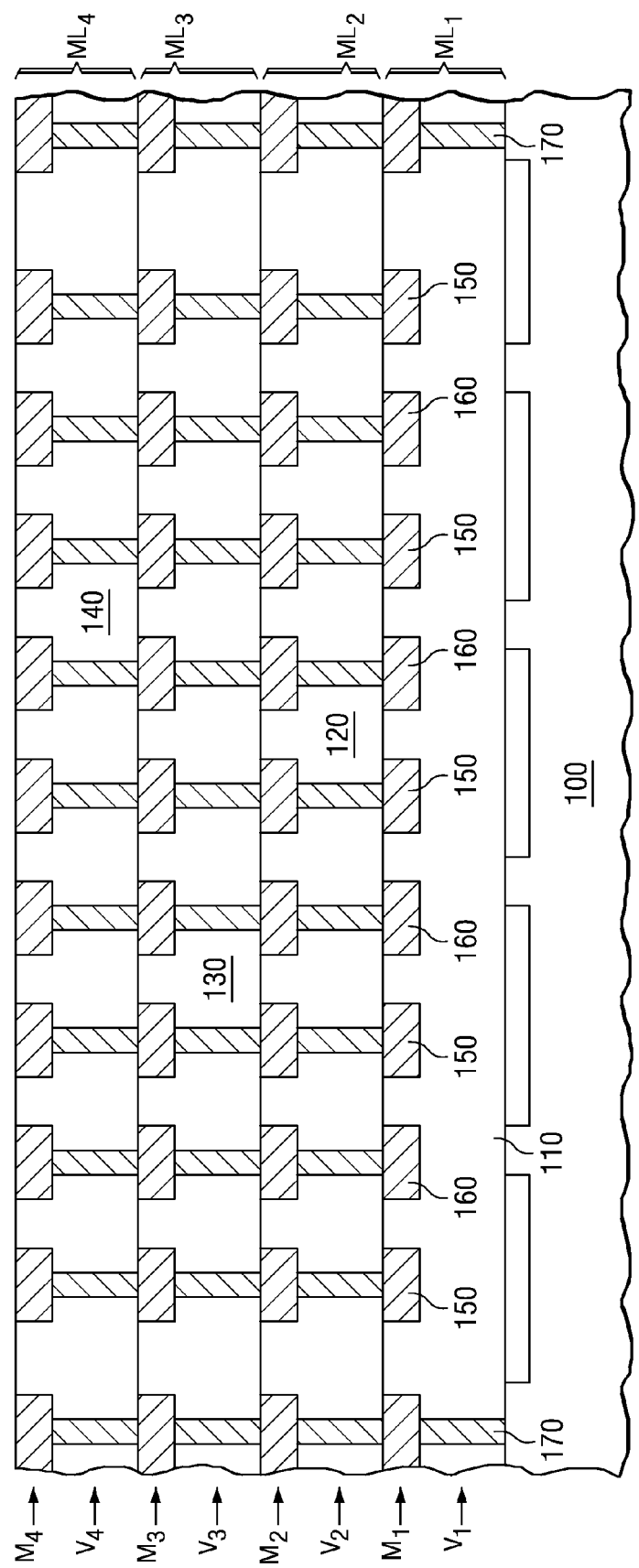
FIGS. 8*a*-8*d*, illustrates a method of fabrication of the MIM capacitor in various stages of fabrication, in accordance with embodiments of the invention.
Figure 8B:
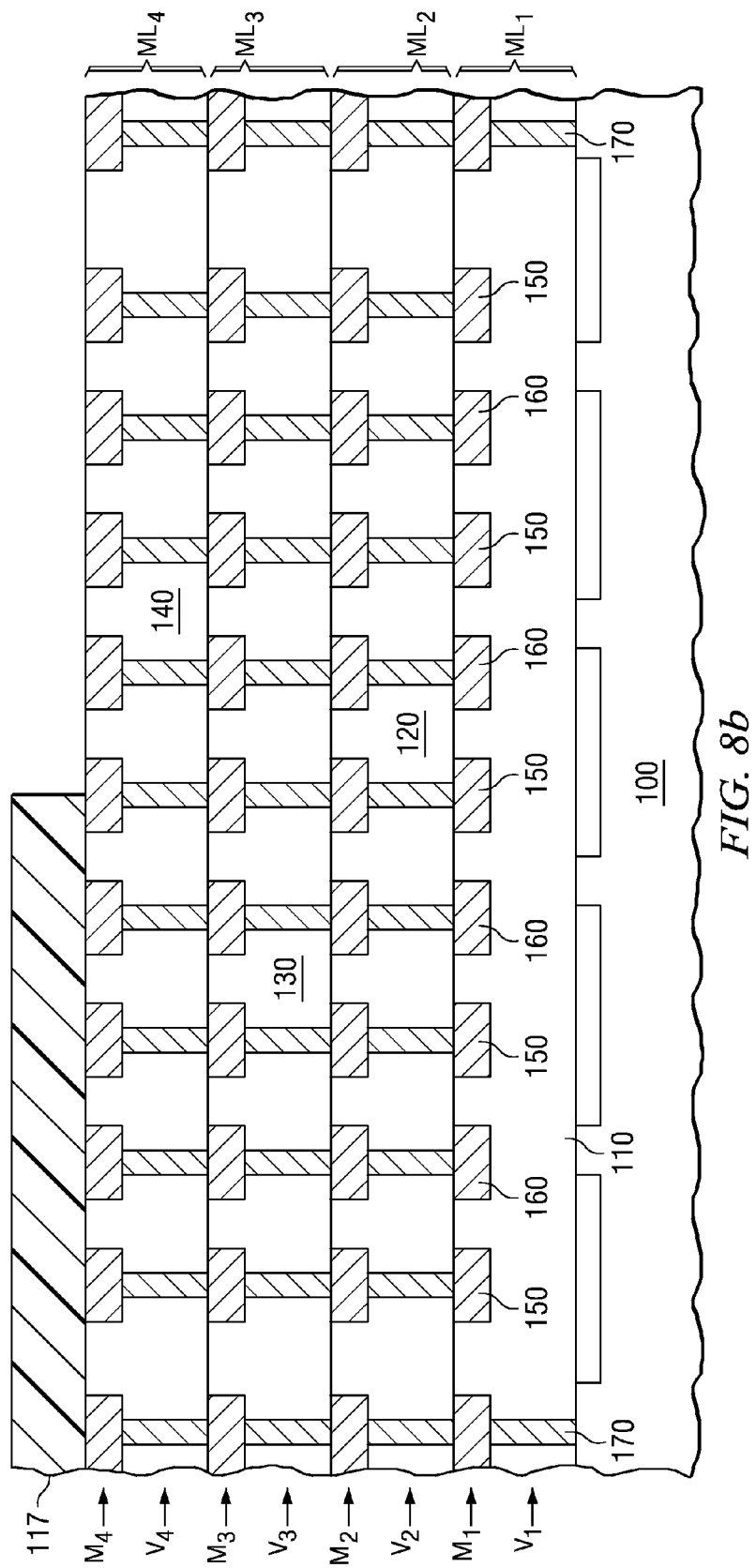
Figure 8C:
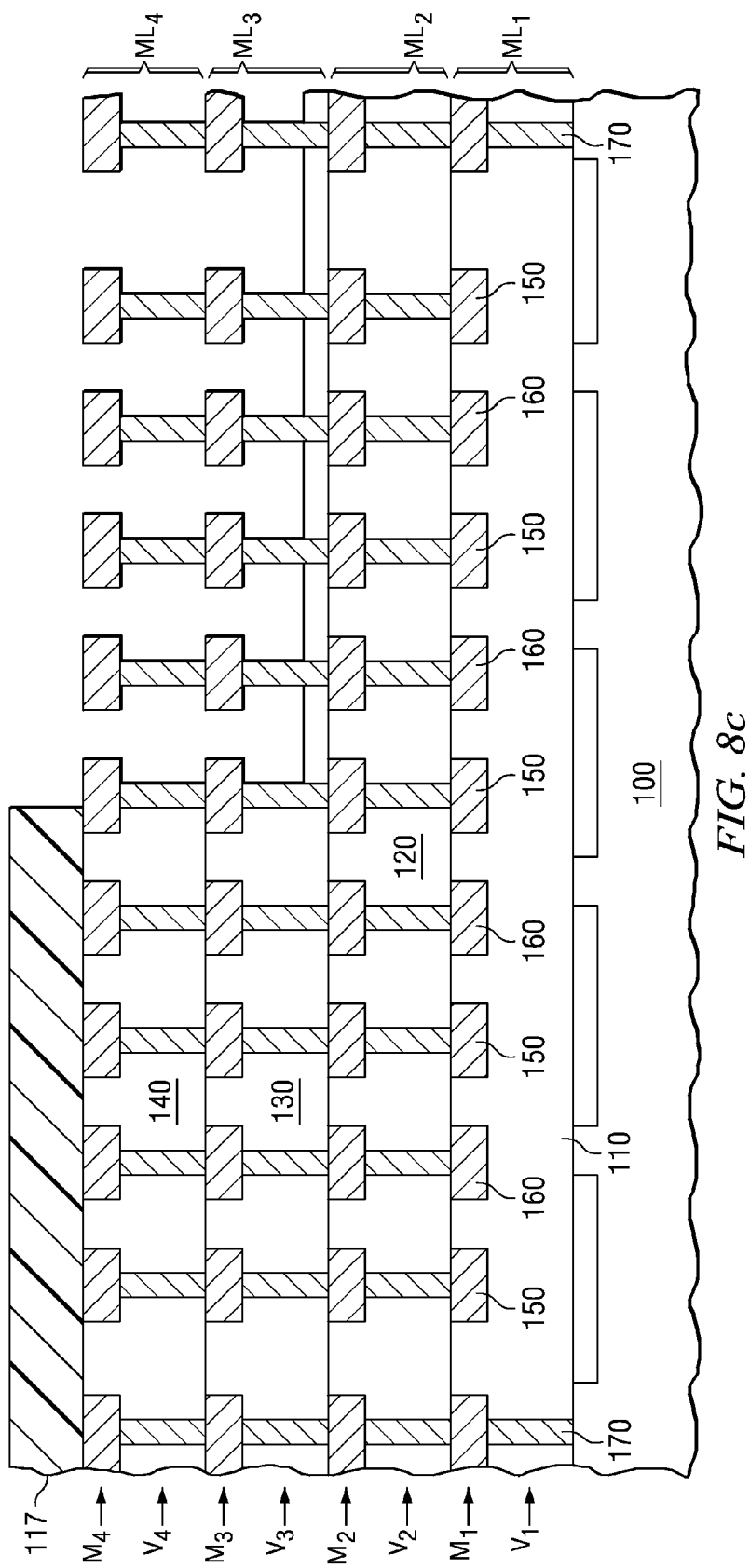
Figure 8D:
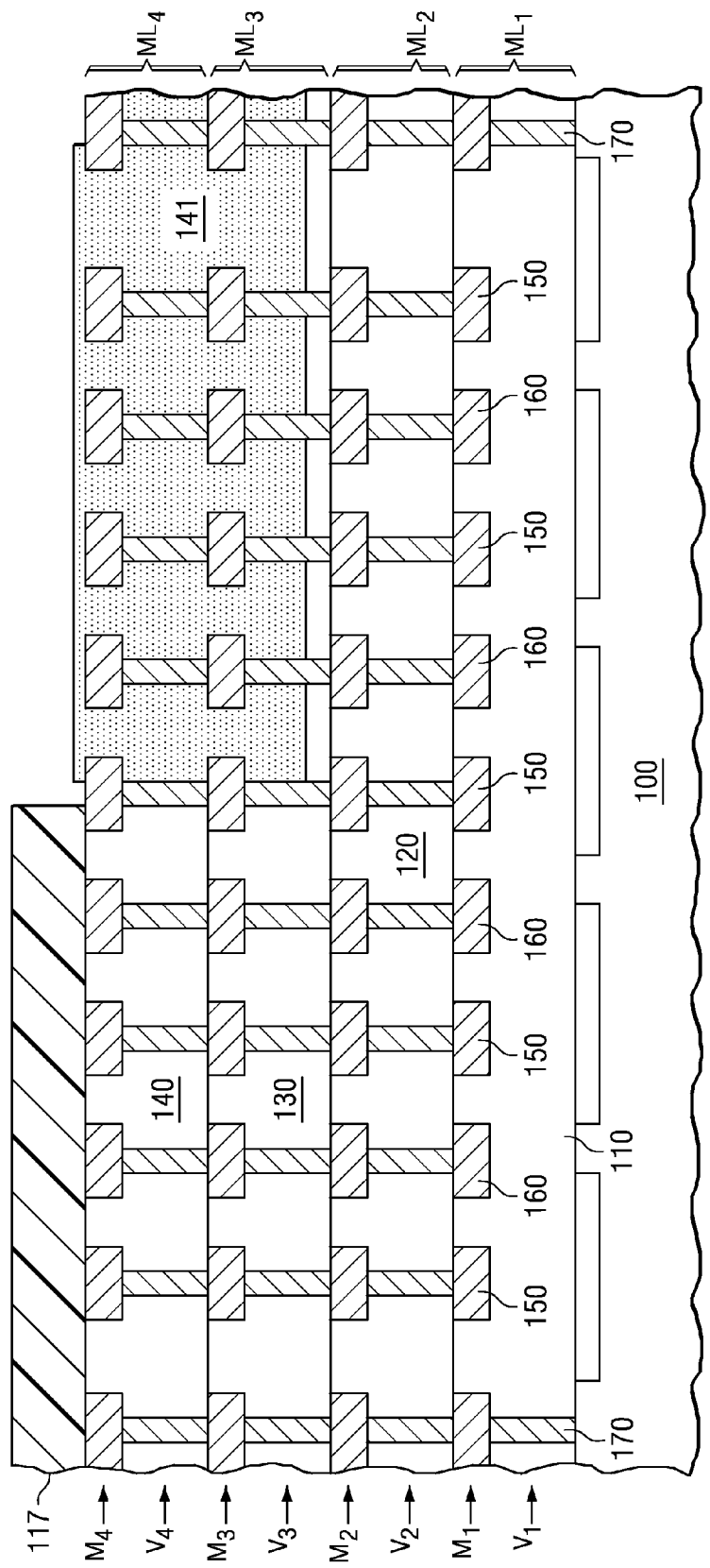

Referring to FIG. 8a, the process follows the previous embodiment as described in FIG. 6g with the formation of the metal levels $ML_1$-$ML_4$ forming the first, second, third and fourth dielectric layers 110, 120, 130 and 140. A photo resist 117 is deposited over the fourth dielectric layer 140 and patterned (FIG. 8b). As illustrated in FIG. 8c, using the photo resist 117 (and an optional hard mask under the photo resist) as a mask, exposed portions of the fourth dielectric layer 140 are etched. In some embodiments (as illustrated in FIG. 8c), the exposed portions of the third dielectric layers 130 are also etched. A different dielectric material (sixth dielectric layer 141) is used to fill the exposed trench. The resulting structure after the dielectric fill and planarization is illustrated in FIG. 8d. A subsequent process for forming the fifth metal level $M_5$ follows processing as described before. In one embodiment, first, second, third and fourth dielectric layers 110, 120, 130 and 140 comprise FSG, whereas the sixth dielectric layer 141 comprises USG. In another embodiment, first, second, third and fourth dielectric layers 110, 120, 130 and 140 comprise USG, whereas the sixth dielectric layer 141 comprises FSG.

Figure 10A:
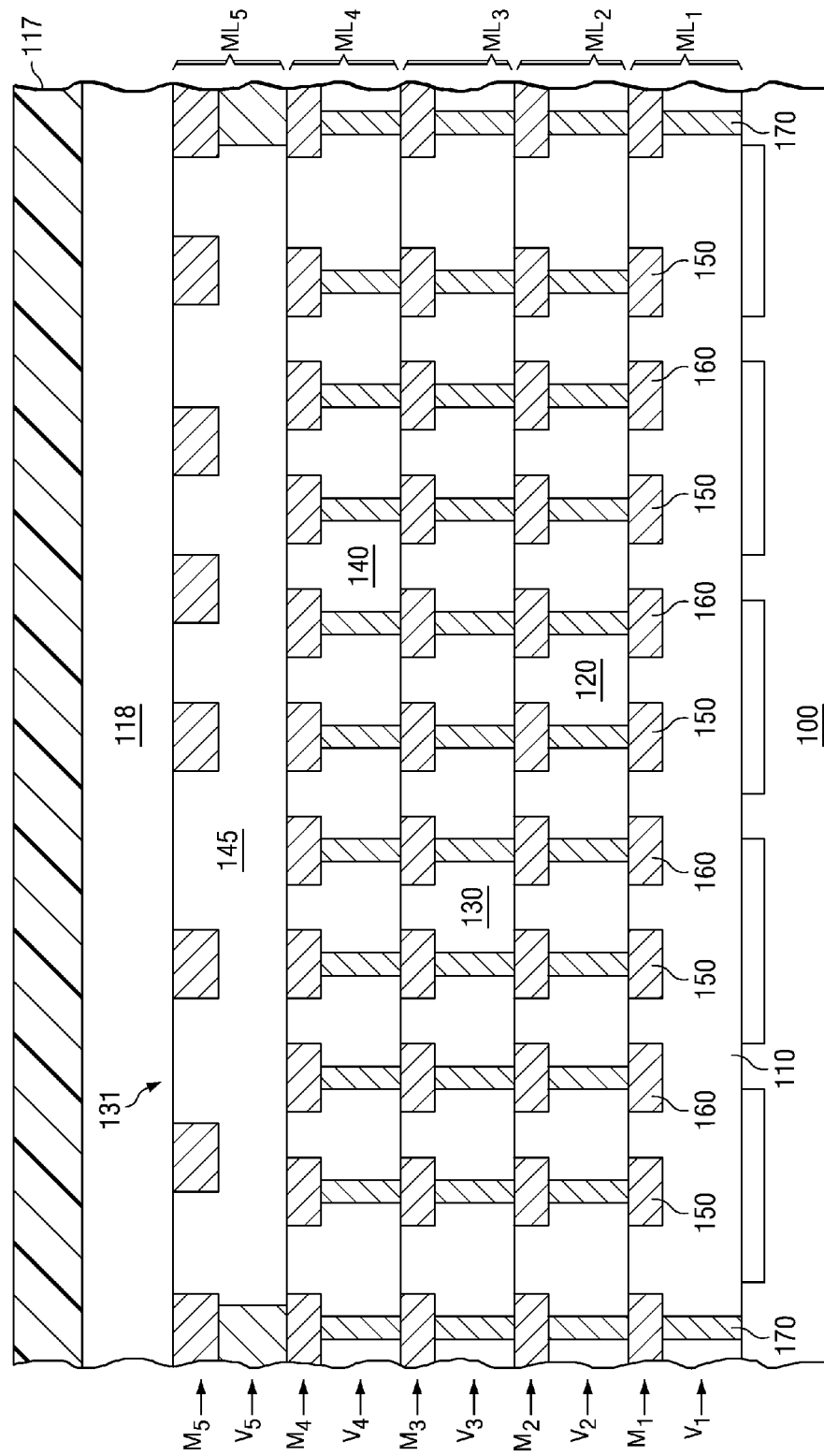
FIGS. 10*a*-10*c*, illustrates a method of fabrication of the MIM capacitor in various stages of fabrication, in accordance with embodiments of the invention.
Figure 10B:
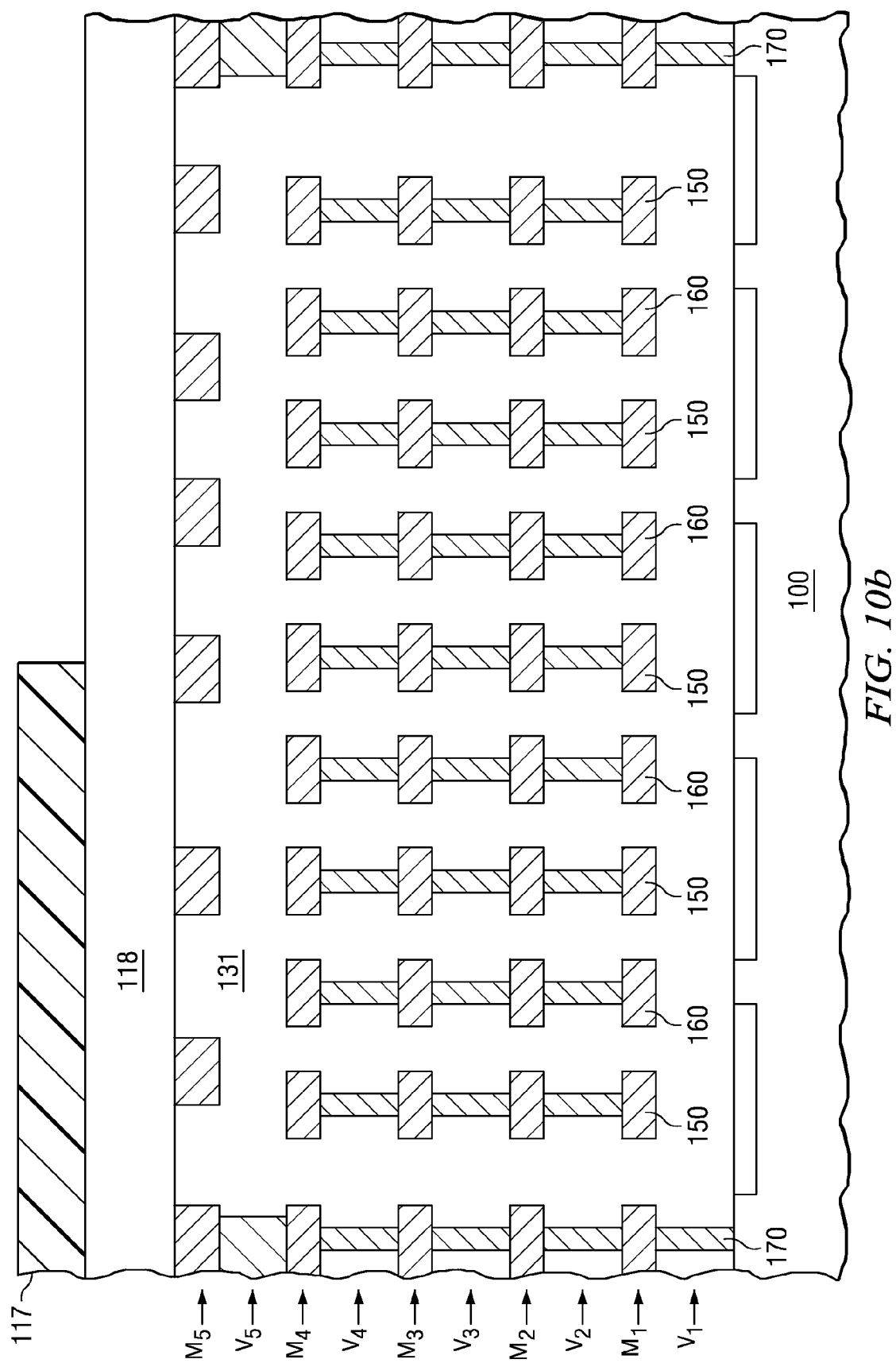
Figure 10C:
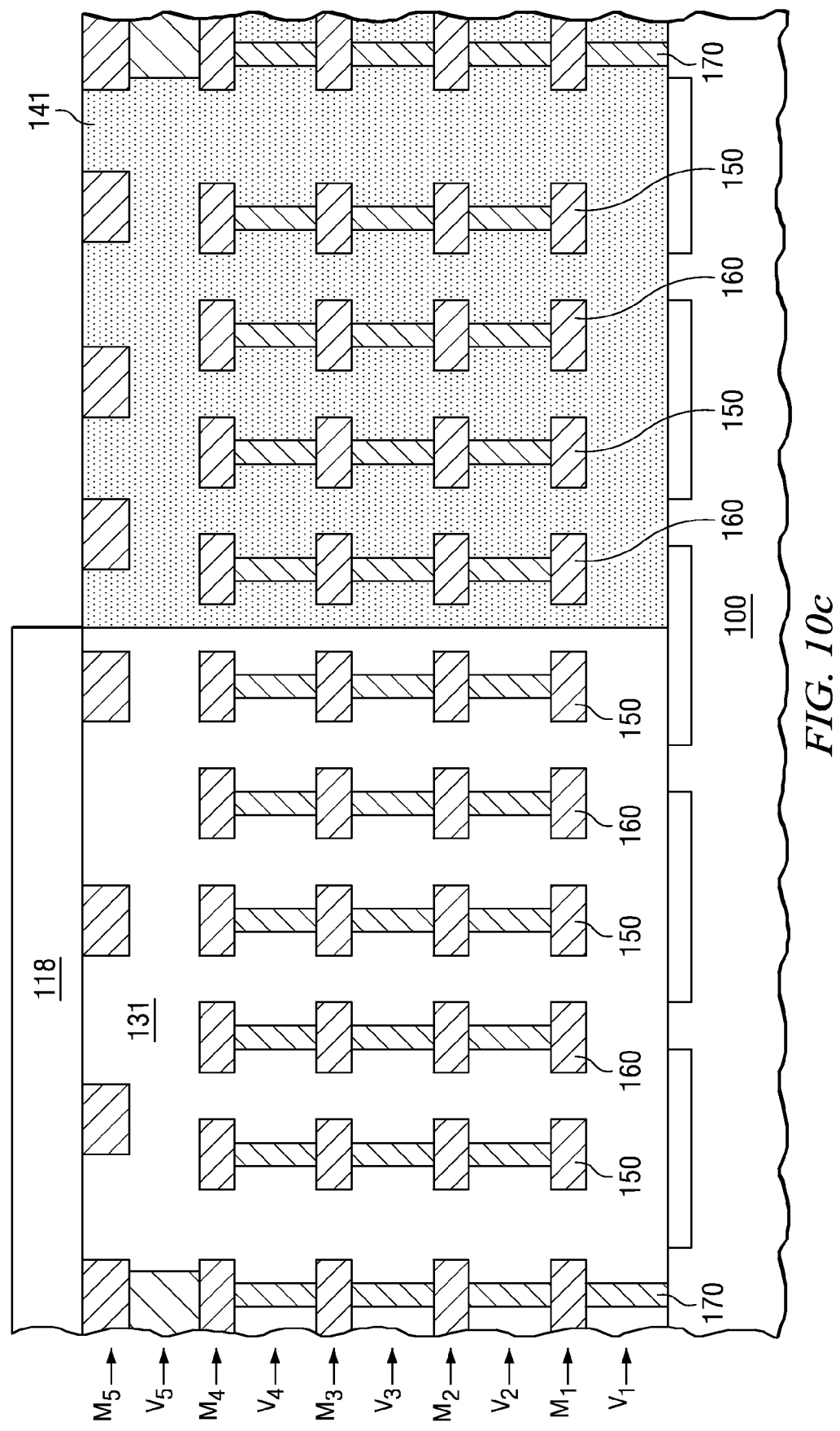
Figure 11:
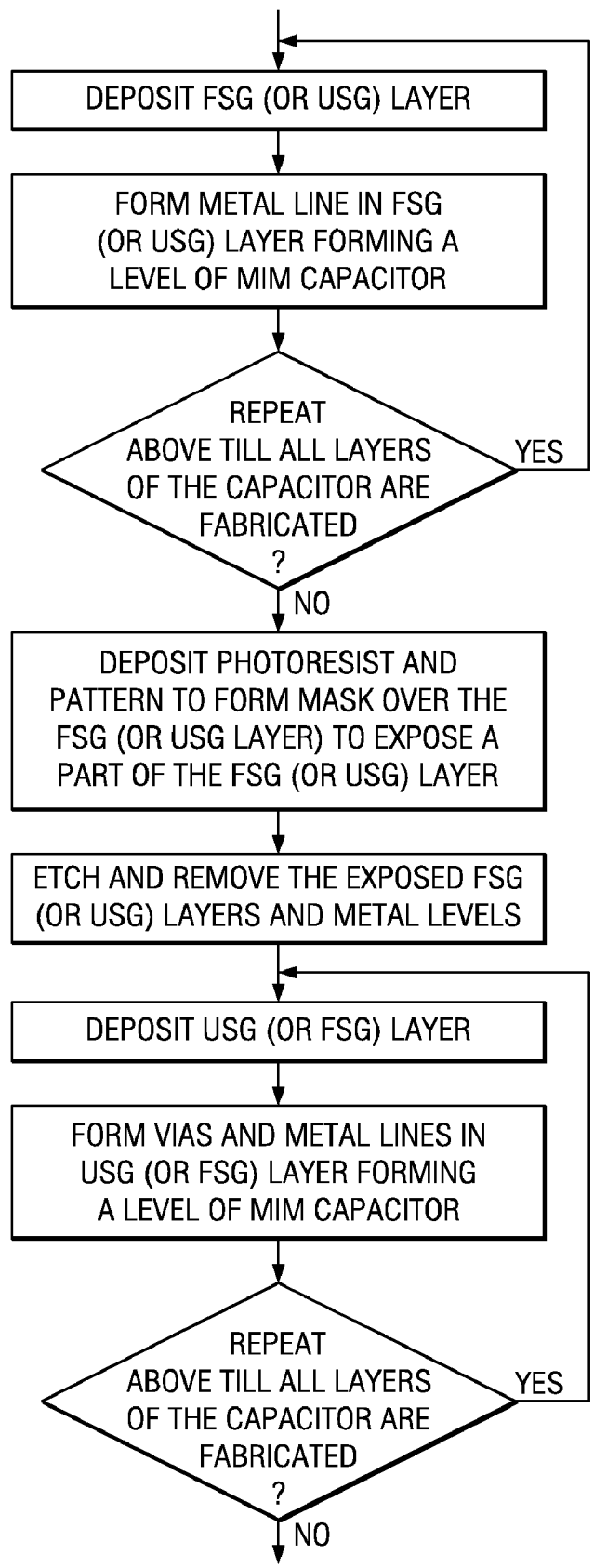
FIG. 11 illustrates a flow chart for formation of the MIM capacitor as illustrated in FIG. 10.

FIG. 10, which includes FIGS. 10a-10c, and flow chart of FIG. 11, illustrates another embodiment of the invention and illustrates the capacitor in various stages of the manufacturing.

Referring to FIG. 10a, the process follows the fabrication steps as in FIGS. 6a-6h. In this embodiment, the first, second, third and fourth dielectric layers 110, 120, 130 and 140 comprise the same dielectric material. Hence, the first, second, third and fourth dielectric layers 110, 120, 130 and 140 comprise the first dielectric material 131. A hard mask layer 118 is deposited and patterned using a photo resist 117. The patterned hard mask 118 exposes the fifth dielectric layer 145. An anisotropic etch removes the fifth dielectric layer 145 and underlying metallization levels (FIG. 10b). As illustrated in FIG. 10c, the metallization levels $ML_1$-$ML_5$ are fabricated in the exposed trench embedded in a sixth dielectric layer 141 comprising a second dielectric material 132 different from the first dielectric material 131 (the dielectric material of the first, second, third and fourth dielectric layers 110, 120, 130 and 140). As an example, the first, second, third and fourth dielectric layers 110, 120, 130 and 140 comprise USG and the sixth dielectric layer 141 comprises FSG.

In various embodiments, four metal layers are shown forming the capacitor. However, in other embodiments more or less number of metallization layers may comprise the capacitor structure. For example, in one embodiment only two metallization levels may be used in forming the capacitor structure with ideal voltage and temperature dependency. Similarly, in various embodiments of the invention, the capacitor comprises a first electrode, a second electrode and a dielectric layer disposed between the first electrode and the second electrode. The dielectric layer comprises a first dielectric material and a second dielectric material, the first and the second dielectric materials comprising materials with opposite coefficient of capacitance. The dielectric layer comprises a mixture of the first dielectric material and the second dielectric material. In various embodiments, the mixture comprises either a homogeneous mixture or a heterogeneous mixture.

In various embodiments, the capacitor comprises multiple capacitors coupled together in parallel or series. For example, in an embodiment, the capacitor comprises a first capacitor and a second capacitor coupled in parallel or in series, the first and second capacitors comprising opposite coefficient of capacitances. The first capacitor comprises the first dielectric material and the second capacitor comprises the second dielectric material, the first dielectric material and the second dielectric material comprising opposite coefficient of capacitances. For example, the first dielectric material comprises un-doped silicon glass (USG), and the second dielectric material comprises fluorinated silicon glass (FSG).

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a capacitor, the method comprising:
   forming a first electrode;
   forming a second electrode; and
   forming a dielectric layer between the first electrode and the second electrode, the dielectric layer comprising a first dielectric material and a second dielectric material, wherein the first and the second dielectric materials comprise materials with opposite coefficient of capacitance, wherein the first dielectric material comprises un-doped silicon glass (USG), and wherein the second dielectric material comprises fluorinated silicon glass (FSG).

2. The method of claim 1, wherein the dielectric layer comprises a mixture of the first dielectric material and the second dielectric material.

3. The method of claim 2, wherein the mixture is a homogenous mixture.

4. The method of claim 2, wherein the mixture is a heterogeneous mixture.

5. The method of claim 1, wherein the capacitor comprises a first capacitor and a second capacitor coupled in parallel, the first and the second capacitors comprising opposite coefficient of capacitances.

6. The method of claim 5, wherein the first capacitor comprises the first dielectric material and the second capacitor comprises the second dielectric material.

7. The method of claim 1, wherein the capacitor comprises a first capacitor and a second capacitor coupled in series, the first and the second capacitors comprising opposite coefficient of capacitances.

8. The method of claim 1, wherein a first layer comprising the first dielectric material is disposed between a second layer comprising the second dielectric material and the first electrode.

9. A method of fabricating a capacitor, the method comprising:
forming a first metal structure overlying a substrate;
forming a second metal structure overlying the substrate;
forming a first dielectric material between a first portion of the first metal structure and a first portion of the second metal structure; and
forming a second dielectric material between a second portion of the first metal structure and a second portion of the second metal structure, wherein no first dielectric material is disposed between the second portion of the first metal structure and the second portion of the second metal structure, wherein no second dielectric material is disposed between the first portion of the first metal structure and the first portion of the second metal structure, wherein at least a first portion of the second dielectric material is disposed above a first portion of the first dielectric material and wherein a second portion of the second dielectric material is laterally adjacent a second portion of the first dielectric material, wherein the first metal structure, the second metal structure, the first dielectric material, and the second dielectric material are configured to form a single capacitor, and wherein the first and the second dielectric comprise materials with opposite coefficient of capacitance.

10. The method of claim 9, wherein the capacitor is disposed in multiple metal levels of a semiconductor component.

11. The method of claim 9, wherein at least a portion of the second dielectric material is above the first dielectric material.

12. The method of claim 9, wherein the first portion of the first metal structure comprises a first finger structure disposed in a first metal level, and wherein the second portion of the first metal structure comprises a second finger structure disposed in a second metal level.

13. The method of claim 12, wherein the first portion of the second metal structure comprises a third finger structure disposed in the first metal level, and wherein the second portion of the second metal structure comprises a fourth finger structure disposed in the second metal level.

14. The method of claim 13, wherein the second finger structure is disposed above the first finger structure, and wherein the fourth finger structure is disposed above the third finger structure.

15. The method of claim 14, wherein the first and the second finger structures are interlaced together, and wherein the third and the fourth finger structures are interlaced together.

16. A method of fabricating a capacitor, the method comprising:
forming a first metal structure overlying a substrate;
forming a second metal structure overlying the substrate;
forming a first dielectric material between a first portion of the first metal structure and a first portion of the second metal structure; and
forming a second dielectric material between a second portion of the first metal structure and a second portion of the second metal structure, wherein no first dielectric material is disposed between the second portion of the first metal structure and the second portion of the second metal structure, wherein no second dielectric material is disposed between the first portion of the first metal structure and the first portion of the second metal structure, wherein the first metal structure, the second metal structure, the first dielectric material, and the second dielectric material are configured to form a single capacitor, and wherein the first and the second dielectric materials comprise materials with opposite coefficient of capacitance, wherein the second dielectric material is laterally adjacent the first dielectric material, wherein the first metal structure comprises a first vertical pillar structure and a second vertical pillar structure, and wherein the second metal structure comprises a third vertical pillar structure and a fourth vertical pillar structure.

17. The method of claim 16, wherein the first dielectric material is disposed between a third portion of the first metal structure and a third portion of the second metal structure, and wherein the second dielectric material is disposed between the third portion of the first metal structure and the third portion of the second metal structure.

18. The method of claim 9, wherein the first and the second dielectric materials comprise materials with opposite temperature coefficient of capacitance (TCC).

19. The method of claim 18, wherein a dielectric constant of the first dielectric material increases with an increase in temperature, and wherein a dielectric constant of the second dielectric material decreases with an increase in temperature.

20. The method of claim 9, wherein the first and the second dielectric materials comprise materials with opposite voltage coefficient of capacitance.

21. The method of claim 9, wherein the first dielectric material comprises a high-k dielectric material.

22. A method of fabricating a finger capacitor, the method comprising:
depositing a first insulating layer over a substrate;
forming first metal lines disposed in the first insulating layer, the first metal lines forming a first level of an interlaced finger capacitor comprising a first inner plate and a first outer plate, the first inner plate and the first outer plate capacitively coupled via the first insulating layer;
depositing a second insulating layer over the first insulating layer; and forming second metal lines disposed in the second insulating layer, the second metal lines forming a second level of the interlaced finger capacitor comprising a second inner plate and a second outer plate, the second inner plate and the second outer plate capacitively coupled via the second insulating layer, wherein the first inner plate and the second inner plate are electrically coupled, wherein the first outer plate and the second outer plate are electrically coupled;

depositing a third insulating layer over the first insulating layer;

forming third metal lines disposed in the third insulating layer, the third metal lines forming a third level of the interlaced finger capacitor comprising a third inner plate and a third outer plate, the third inner plate and the third outer plate capacitively coupled via the third insulating layer;

depositing a fourth insulating layer over the first insulating layer; and forming fourth metal lines disposed in the fourth insulating layer, the fourth metal lines forming a fourth level of the interlaced finger capacitor comprising a fourth inner plate and a fourth outer plate, the fourth inner plate and the fourth outer plate capacitively coupled via the fourth insulating layer, wherein the third inner plate and the fourth inner plate are electrically coupled to the first and the second inner plates, wherein the third and the fourth outer plates are electrically coupled to the first and the second outer plates, wherein the first and the second inner plates, the first and second outer plates, the first and the second insulating layers, the third and the fourth inner plates, the third and fourth outer plates, and the third and the fourth insulating layers fat n a single capacitor, wherein a capacitance of the single capacitor is insensitive to variations in temperature or voltage, and wherein the first and third insulating layers comprise un-doped silicon glass (USG) and the second and the fourth insulating layers comprise fluorinated silicon glass (FSG).

23. The method of claim 22, wherein the first and the second insulating layers comprise a different dielectric material.

24. The method of claim 22, wherein the first and third insulating layers comprise a same dielectric material, wherein the second and fourth insulating layers comprise a same dielectric material.

25. A method of fabricating a finger capacitor, the method comprising:

depositing a first insulating layer over a substrate;

forming first metal lines disposed in the first insulating layer, the first metal lines forming a first level of an interlaced finger capacitor comprising a first inner plate and a first outer plate, the first inner plate and the first outer plate capacitively coupled via the first insulating layer;

depositing a second insulating layer over the first insulating layer; and forming second metal lines disposed in the second insulating layer, the second metal lines forming a second level of the interlaced finger capacitor comprising a second inner plate and a second outer plate, the second inner plate and the second outer plate capacitively coupled via the second insulating layer, wherein the first inner plate and the second inner plate are electrically coupled, wherein the first outer plate and the second outer plate are electrically coupled;

depositing a third insulating layer over the first insulating layer;

forming third metal lines disposed in the third insulating layer, the third metal lines forming a third level of the interlaced finger capacitor comprising a third inner plate and a third outer plate, the third inner plate and the third outer plate capacitively coupled via the third insulating layer;

depositing a fourth insulating layer over the first insulating layer; and forming fourth metal lines disposed in the fourth insulating layer, the fourth metal lines forming a fourth level of the interlaced finger capacitor comprising a fourth inner plate and a fourth outer plate, the fourth inner plate and the fourth outer plate capacitively coupled via the fourth insulating layer, wherein the third inner plate and the fourth inner plate are electrically coupled to the first and the second inner plates, wherein the third and the fourth outer plates are electrically coupled to the first and the second outer plates, wherein the first and the second inner plates, the first and second outer plates, the first and the second insulating layers, the third and the fourth inner plates, the third and fourth outer plates, and the third and the fourth insulating layers foam a single capacitor, wherein a capacitance of the single capacitor is insensitive to variations in temperature or voltage, and wherein the first and fourth insulating layers comprise fluorinated silicon glass (FSG) and the second and the third insulating layers comprise un-doped silicon glass (USG).

26. The method of claim 25, wherein the first and fourth insulating layers comprise a same dielectric material, wherein the second and the third insulating layers comprise a same dielectric material.

* * * * *

UNITED STATES PATENT AND TRADEMARK OFFICE
CERTIFICATE OF CORRECTION

| | | |
|---|---|---|
| PATENT NO. | : 8,101,495 B2 | |
| APPLICATION NO. | : 12/048060 | |
| DATED | : January 24, 2012 | |
| INVENTOR(S) | : Riess et al. | |

It is certified that error appears in the above-identified patent and that said Letters Patent is hereby corrected as shown below:

In Col. 13, line 33, claim 22, delete "fat n" and insert --form--.
In Col. 14, line 39, claim 25, delete "foam" and insert --form--.

Signed and Sealed this
Twelfth Day of June, 2012

David J. Kappos
*Director of the United States Patent and Trademark Office*